(12) United States Patent
Chiou et al.

(10) Patent No.: US 9,716,498 B2
(45) Date of Patent: Jul. 25, 2017

(54) IMPEDANCE-TO-DIGITAL CONVERTER, IMPEDANCE-TO-DIGITAL CONVERTING DEVICE, AND METHOD FOR ADJUSTMENT OF IMPEDANCE-TO-DIGITAL CONVERTING DEVICE

(71) Applicant: NATIONAL CHIAO TUNG UNIVERSITY, Hsinchu (TW)

(72) Inventors: Jin-Chern Chiou, Hsinchu (TW); Shun-Hsi Hsu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 15/259,187

(22) Filed: Sep. 8, 2016

(65) Prior Publication Data
US 2017/0163260 A1 Jun. 8, 2017

(30) Foreign Application Priority Data
Dec. 4, 2015 (TW) .............................. 104140663 A

(51) Int. Cl.
H03M 3/00 (2006.01)
H03M 1/12 (2006.01)
H03K 19/00 (2006.01)

(52) U.S. Cl.
CPC ................................ *H03K 19/0005* (2013.01)

(58) Field of Classification Search
CPC ...... H03M 1/20; H03M 1/002; H03M 1/0604; H03M 1/188; H03M 1/36; H03M 1/56; H03M 3/00; H03M 1/12; H01L 27/14643

USPC .................................... 326/30; 341/172, 139
See application file for complete search history.

(56) References Cited

U.S. PATENT DOCUMENTS

| 5,659,314 A * | 8/1997 | Tokura ..................... H03M 3/43 341/143 |
| 6,140,952 A | 10/2000 | Gaboury |
| 6,452,521 B1 | 9/2002 | Wang |
| 6,473,018 B2 * | 10/2002 | Ueno ..................... H03M 3/494 341/143 |
| 2012/0112947 A1 * | 5/2012 | Krauss ..................... H03M 1/60 341/172 |

FOREIGN PATENT DOCUMENTS

CN 102318193 B 8/2014

OTHER PUBLICATIONS

Sechang Oh, et al., "A Dual-Slope Capacitance-to-Digital Converter Integrated in an Implantable Pressure-Sensing System," IEEE Journal of Solid-State Circuits, vol. 50, No. 7, pp. 1581-1591, Jul. 2015.
Hyunsoo Ha, et al., "A 160nW 63.9fJ/conversion-step Capacitance-to-Digital Converter for Ultra-Low-Power Wireless Sensor Nodes," Digest of Technical Papers—2014 IEEE International Solid-State Circuits Conference, pp. 220-221, Feb. 11, 2014.

* cited by examiner

*Primary Examiner* — Daniel D Chang
(74) *Attorney, Agent, or Firm* — Michael Best & Friedrich LLP

(57) ABSTRACT

An impedance-to-digital converter is provided. A sensible impedance range of the impedance-to-digital converter is adjustable by changing magnitudes of signals inputted thereto.

17 Claims, 16 Drawing Sheets

IMPEDANCE-TO-DIGITAL CONVERTER, IMPEDANCE-TO-DIGITAL CONVERTING DEVICE, AND METHOD FOR ADJUSTMENT OF IMPEDANCE-TO-DIGITAL CONVERTING DEVICE

CROSS-REFERENCE TO RELATED APPLICATION

This application claims priority of Taiwanese Patent Application No. 104140663, filed on Dec. 4, 2015.

FIELD

The disclosure relates to a conversion device, and more particularly to an impedance-to-digital converting device.

BACKGROUND

A conventional capacitance-to-digital technique is used for sensing capacitance of a capacitor, and uses a limited number of digital codes to represent the different capacitances sensed thereby. Accordingly, it is unable to achieve a high sensing resolution and a wide sensible capacitance range at the same time. FIG. 1 shows a relationship between the sensible capacitance ranges and the sensing resolutions of a conventional capacitance-to-digital converter that has multiple sensible capacitance ranges with different sensing resolutions. Assuming that the conventional capacitance-to-digital converter of FIG. 1 uses one hundred digital codes to represent the capacitances sensed thereby, the sensing resolution is inversely proportional to capacitance variation per unit increment of the digital code (i.e., a greater capacitance variation per change of the digital code indicating a lower sensing resolution). Accordingly, in FIG. 1, a unit increment of the digital code represents capacitance variation of 0.14 pF in a sensible capacitance range of 2 pF-16 pF, a unit increment of the digital code represents capacitance variation of 0.48 pF in a sensible capacitance range of 16 pF-64 pF, and a unit increment of the digital code represents capacitance variation of 1.92 pF in a sensible capacitance range of 64 pF-256 pF. Thus, such a conventional capacitance-to-digital converter is unable to achieve a high resolution when sensing a larger capacitor.

SUMMARY

Therefore, an object of the disclosure is to provide an impedance-to-digital converter that may alleviate the drawback of the prior art.

According to the disclosure, the impedance-to-digital converter is provided for sensing an impedance value of a to-be-sensed component, and includes a sensing unit, an offset impedance unit, a reference impedance unit and a conversion block.

The sensing unit is to be coupled to the to-be-sensed component, is disposed to receive a sensing signal, and is configured to periodically convert the sensing signal into a first electric charge by providing, within every operation period of the impedance-to-digital converter, the sensing signal to the to-be-sensed component. An amount of the first electric charge of the impedance-to-digital converter is proportional to a magnitude of the sensing signal. The offset impedance unit is disposed to receive an offset signal, and is configured to convert the offset signal into a second electric charge every operation period of the impedance-to-digital converter. An amount of the second electric charge is proportional to a magnitude of the offset signal. The reference impedance unit is disposed to receive a reference signal and a digital signal, and includes a reference impedance circuit configured to convert the reference signal into a third electric charge every operation period of the impedance-to-digital converter. An amount of the third electric charge is proportional to a magnitude of the reference signal. A polarity of the third electric charge is associated with a logic level of the digital signal. The conversion block receives the first electric charge, the second electric charge and the third electric charge that are respectively outputted by the sensing unit, the offset impedance unit and the reference impedance unit to cooperatively form a resultant electric charge, and is configured to convert the resultant electric charge into the digital signal. The impedance value sensed by the impedance-to-digital converter has a linear relationship with a number of the operation periods that correspond to a predetermined logic level of the digital signal among a predetermined number of the operation periods. A central value of a sensible impedance range is proportional to a ratio of a magnitude of the offset signal to a magnitude of the sensing signal.

Another object of the disclosure is to provide an impedance-to-digital converting device that may alleviate the drawback of the prior art.

According to the disclosure, the impedance-to-digital converting device is provided for sensing an impedance value of a to-be-sensed component, and includes an impedance-to-digital converter of this disclosure, and an operation unit.

The operation unit is coupled to the conversion block for receiving therefrom the digital signal, and is configured to perform an average operation of a series of logic values of the digital signal to generate a series-average value. The operation unit includes a lookup table recording a pre-stored impedance value that corresponds to the series-average value thus generated, and is further configured to obtain the pre-stored impedance value from the lookup table according to the series-average value, and to output the pre-stored impedance value to serve as a sensed impedance value corresponding to the to-be-sensed component. The impedance value sensed by the impedance-to-digital converting device has a linear relation ship with a number of the operation periods that correspond to a predetermined logic level of the digital signal among a predetermined number of the operation periods. A central value of a sensible impedance range of the impedance-to-digital converter is proportional to a ratio of a magnitude of the offset signal to a magnitude of the sensing signal. The impedance value sensed by impedance-to-digital converting device has a sensing resolution proportional to a ratio of the magnitude of the sensing signal to a magnitude of the reference signal.

Yet another object of the disclosure is to provide a method for adjustment of the impedance-to-digital converting device of this disclosure.

According to the disclosure, the method is to be implemented by a signal generating unit that generates the sensing signal, the offset signal and the reference signal, and includes the step of:

changing, by the signal generating unit, the ratio of the magnitude of the offset signal to the magnitude of the sensing signal, so as to adjust the central value of the sensible impedance range.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
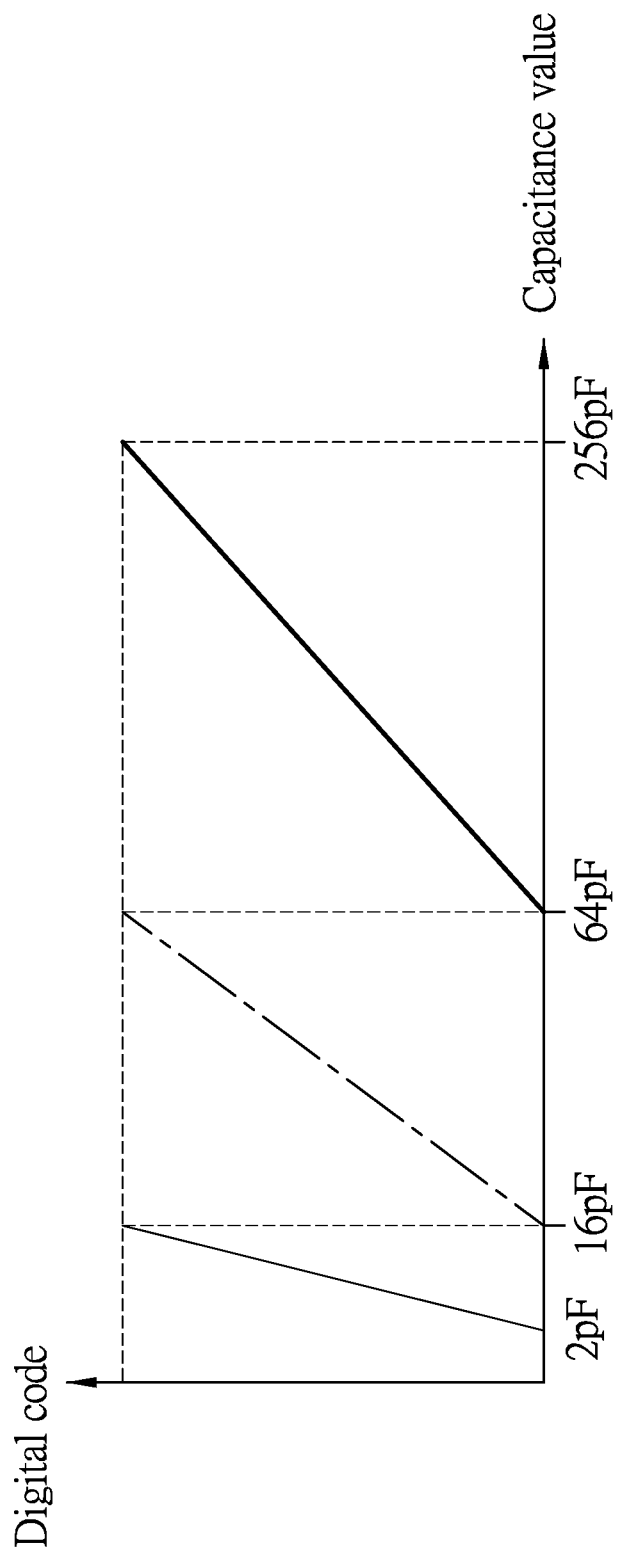
FIG. 1 is a plot illustrating a relationship among sensible capacitance ranges and the sensing resolutions of a conventional capacitance-to-digital converter.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
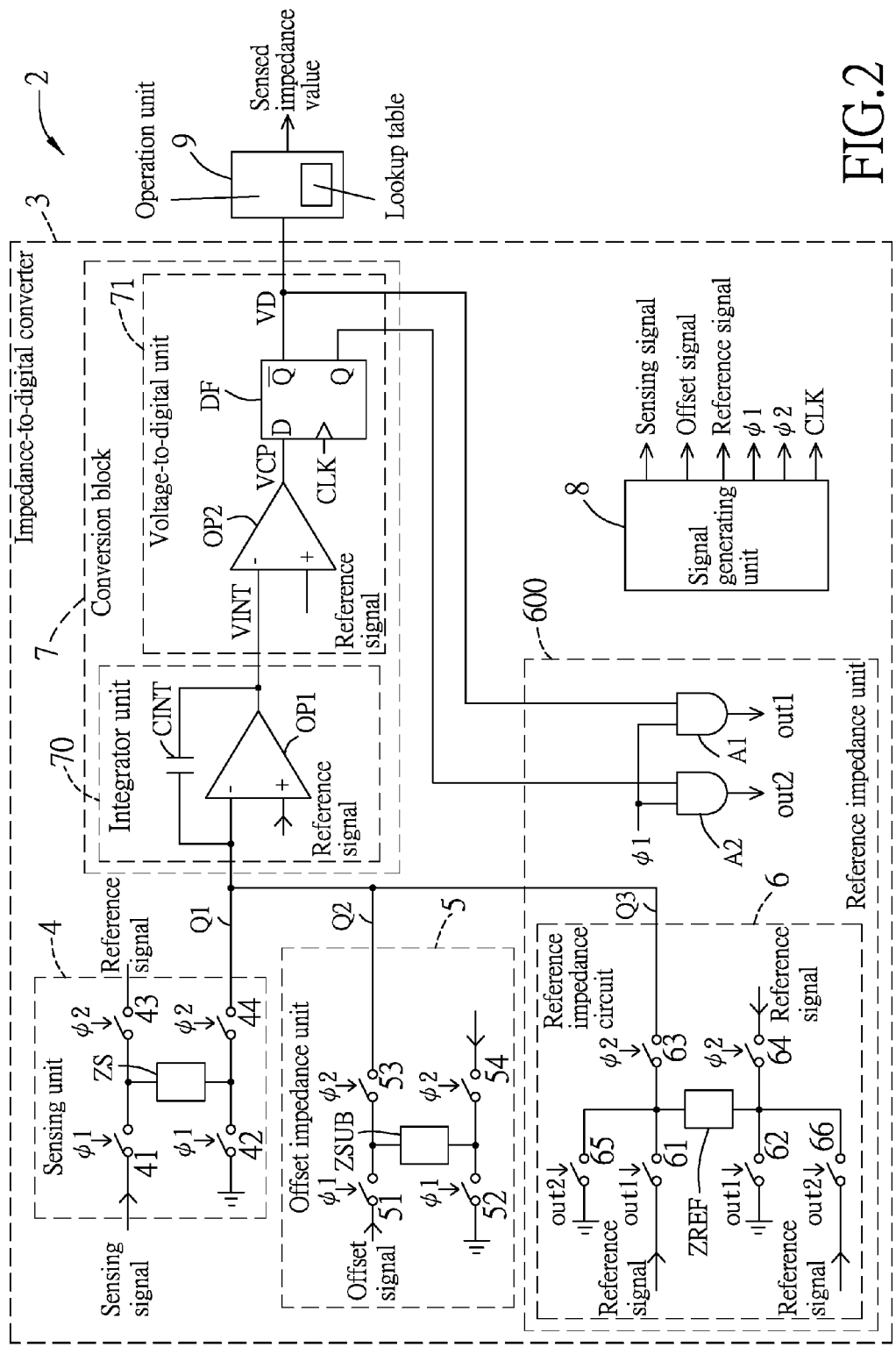
FIG. 2 is a schematic circuit diagram illustrating an embodiment of the impedance-to-digital converting device according to this disclosure.

Referring to FIG. 2, the embodiment of the impedance-to-digital converting device 2 is provided for sensing an impedance value of a to-be-sensed component (ZS), and generates a sensed impedance value corresponding to the to-be-sensed component (ZS). The impedance-to-digital converting device 2 includes an impedance-to-digital converter 3 and an operation unit 9. In this embodiment, the to-be-sensed component (ZS) has a first terminal and a second terminal, and the impedance-to-digital converter 3 includes a sensing unit 4, an offset impedance unit 5, a reference impedance unit 600, a conversion block 7 and a signal generating unit 8.

The sensing unit 4 is coupled to the to-be-sensed component (ZS), receives a sensing signal, and periodically converts the sensing signal into a first electric charge (Q1) by providing, within every operation period of the impedance-to-digital converter, the sensing signal to the to-be-sensed component (ZS). An amount of the first electric charge (Q1) is proportional to a magnitude of the sensing signal. In this embodiment, the sensing unit 4 includes four sensing switches 41-44.

The sensing switch 41 receives a first control signal ($\phi1$), introduces the sensing signal to the first terminal of the to-be-sensed component (ZS) when conducting, and is configured to conduct or not conduct according to the first control signal ($\phi1$).

The sensing switch 42 receives the first control signal ($\phi1$), couples the second terminal of the to-be-sensed component (ZS) to ground when conducting, and is configured to conduct or not conduct according to the first control signal ($\phi1$).

The sensing switch 43 receives a second control signal ($\phi2$), introduces a reference signal to the first terminal of the to-be-sensed component (ZS) when conducting, and is configured to conduct or not conduct according to the second control signal ($\phi2$).

The sensing switch 44 receives the second control signal ($\phi2$), has a first terminal at which the first electric charge (Q1) is outputted when the sensing switch 44 is conducting, and a second terminal coupled to the second terminal of the to-be-sensed component (ZS), and is configured to establish or not establish connection between the first and second terminals thereof to be conducting or non-conducting according to the second control signal ($\phi2$).

The offset impedance unit 5 receives an offset signal, and converts the offset signal into a second electric charge (Q2) periodically (namely, every operation period of the impedance-to-digital converter). An amount of the second electric charge (Q2) is proportional to a magnitude of the offset signal. In this embodiment, the offset impedance unit 5 includes an offset impedance component (ZSUB) and four offset switches 51-54.

The offset impedance component (ZSUB) has a first terminal and a second terminal.

The offset switch 51 receives the first control signal ($\phi1$), introduces the offset signal to the first terminal of the offset impedance component (ZSUB) when conducting, and is configured to conduct or not conduct according to the first control signal ($\phi1$).

The offset switch 52 receives the first control signal ($\phi1$), couples the second terminal of the offset impedance component (ZSUB) to ground when conducting, and is configured to conduct or not conduct according to the first control signal ($\phi1$).

The offset switch 53 receives the second control signal ($\phi2$), has a first terminal at which the second electric charge (Q2) is outputted when the offset switch 53 is conducting, a second terminal coupled to the first terminal of the offset impedance component (ZSUB), and is configured to establish or not establish connection between the first and second terminals thereof to be conducting or non-conducting according to the second control signal ($\phi2$).

The offset switch 54 receives the second control signal ($\phi2$), introduces the reference signal to the second terminal of the offset impedance component (ZSUB) when conducting, and is configured to conduct or not conduct according to the second control signal ($\phi2$).

The reference impedance unit 600 receives the reference signal and a digital signal (VD), and includes a reference impedance circuit 6 that converts the reference signal into a third electric charge (Q3) periodically (namely, every operation period of the impedance-to-digital converter) in this embodiment. An amount of the third electric charge (Q3) is proportional to a magnitude of the reference signal, and a polarity of the third electric charge (Q3) is associated with a logic level of the digital signal (VD). In detail, the reference impedance unit 600 further includes two AND gates (A1, A2), and the reference impedance circuit 6 includes a reference impedance component (ZREF) and six reference switches 61-66, but this disclosure is not limited thereto.

The AND gate (A1) performs AND operation on the digital signal (VD) and the first control signal (φ1) so as to generate a first operation signal (out1).

The AND gate (A2) perform AND operation on the first control signal (φ1) and an inverted digital signal that is complementary to the digital signal (VD) so as to generate a second operation signal (out2).

The reference impedance component (ZREF) has a first terminal and a second terminal.

The reference switch 61 is coupled to the AND gate (A1) to receive the first operation signal (out1) therefrom, introduces the reference signal to the first terminal of the reference impedance component (ZREF) when conducting, and is configured to conduct or not conduct according to the first operation signal (out1).

The reference switch 62 is coupled to the AND gate (A1) to receive the first operation signal (out1) therefrom, couples the second terminal of the reference impedance component (ZREF) to ground when conducting, and is configured to conduct or not conduct according to the first operation signal (out1).

The reference switch 63 receives the second control signal (φ2), has a first terminal at which the third electric charge (Q3) is outputted when the reference switch 63 is conducting, and a second terminal coupled to the first terminal of the reference impedance component (ZREF), and is configured to establish or not establish connection between the first and second terminals thereof to be conducting or non-conducting according to the second control signal (φ2).

The reference switch 64 receives the second control signal (φ2), introduces the reference signal to the second terminal of the reference impedance component (ZREF) when conducting, and is configured to conduct or not conduct according to the second control signal (φ2).

The reference switch 65 is coupled to the AND gate (A2) to receive the second operation signal (out2) therefrom, couples the first terminal of the reference impedance component (ZREF) to ground when conducting, and is configured to conduct or not conduct according to the second operation signal (out2).

The reference switch 66 is coupled to the AND gate (A2) to receive the second operation signal (out2) therefrom, introduces the reference signal to the second terminal of the reference impedance component (ZREF) when conducting, and is configured to conduct or not conduct according to the second operation signal (out2).

Accordingly, when both of the digital signal (VD) and the first control signal (φ1) have a high voltage level (i.e., logic "1"), the first operation signal (out1) has a high voltage level and the reference switches 61, 62 conduct, while the second operation signal (out2) has a low voltage level and the reference switches 65, 66 do not conduct. When the digital signal (VD) has a low voltage level (i.e., logic 0) and the first control signal (φ1) has the high voltage level, the first operation signal (out1) has a low voltage level and the reference switches 61, 62 do not conduct, while the second operation signal (out2) has a high voltage level and the reference switches 65, 66 conduct.

The conversion block 7 receives the first electric charge (Q1), the second electric charge (Q2) and the third electric charge (Q3) that are respectively outputted by the sensing unit 4, the offset impedance unit 5 and the reference impedance unit 6 to cooperatively form a resultant electric charge, and converts the resultant electric charge into the digital signal (VD). In this embodiment, the conversion block 7 includes an integrator unit 70 and a voltage-to-digital unit 71.

The integrator unit 70 receives the first, second and third electric charges (Q1, Q2, Q3) that cooperatively form the resultant electric charge, and converts the resultant electric charge into an integrator voltage (VINT). The integrator unit 70 of this embodiment includes an operational amplifier (OP1) and an integrator capacitor (CINT).

The operational amplifier (OP1) has a first input (−, representing an inverting input) coupled to the first terminals of the sensing switch 44, the offset switch 53 and the reference switch 63 for respectively receiving therefrom the first, second and third electric charges (Q1, Q2, Q3) to cooperatively form the resultant electric charge, a second input (+, representing a non-inverting input) receiving the reference signal, and an output at which the integrator voltage (VINT) is outputted.

The integrator capacitor (CINT) is coupled between the first input (−) and the output of the operational amplifier (OP1).

The voltage-to-digital unit 71 is coupled to the integrator unit 70 for receiving therefrom the integrator voltage (VINT), and converts a magnitude of the integrator voltage (VINT) into the digital signal (VD). The voltage-to-digital unit 71 of this embodiment includes a comparator and a D flip-flop (DF).

In this embodiment, the comparator of the voltage-to-digital unit 71 is implemented using an operational amplifier (OP2) that has a first input (−) coupled to the output of the integrator unit 70 for receiving therefrom the integrator voltage (VINT), a second input (+) receiving the reference signal, and an output at which a comparison signal (VCP) is outputted.

The D flip-flop (DF) has a data input (D) coupled to the output of the operational amplifier (OP2), a clock input receiving a clock signal (CLK), an inverting output ($\overline{Q}$) at which the digital signal (VD) is outputted, and a non-inverting output (Q) at which the inversed digital signal is outputted.

The signal generating unit 8 is configured to generate the desired sensing signal, offset signal, reference signal, first control signal (φ1), second control signals (φ2) and clock signal (CLK).

The operation unit 9 is coupled to the voltage-to-digital unit 71 for receiving therefrom the digital signal (VD), and performs an average operation on a series of logic values of the digital signal (VD) to generate a series-average value. In this embodiment, the operation unit 9 includes a lookup table recording a plurality of pre-stored impedance values that correspond to different series-average values, so that the operation unit 8 may obtain from the lookup table a pre-stored impedance value that corresponds to the series-average value thus generated, and then output the obtained pre-stored impedance value in digital format to serve as a sensed impedance value corresponding to the to-be-sensed component (ZS).

Figure 3:
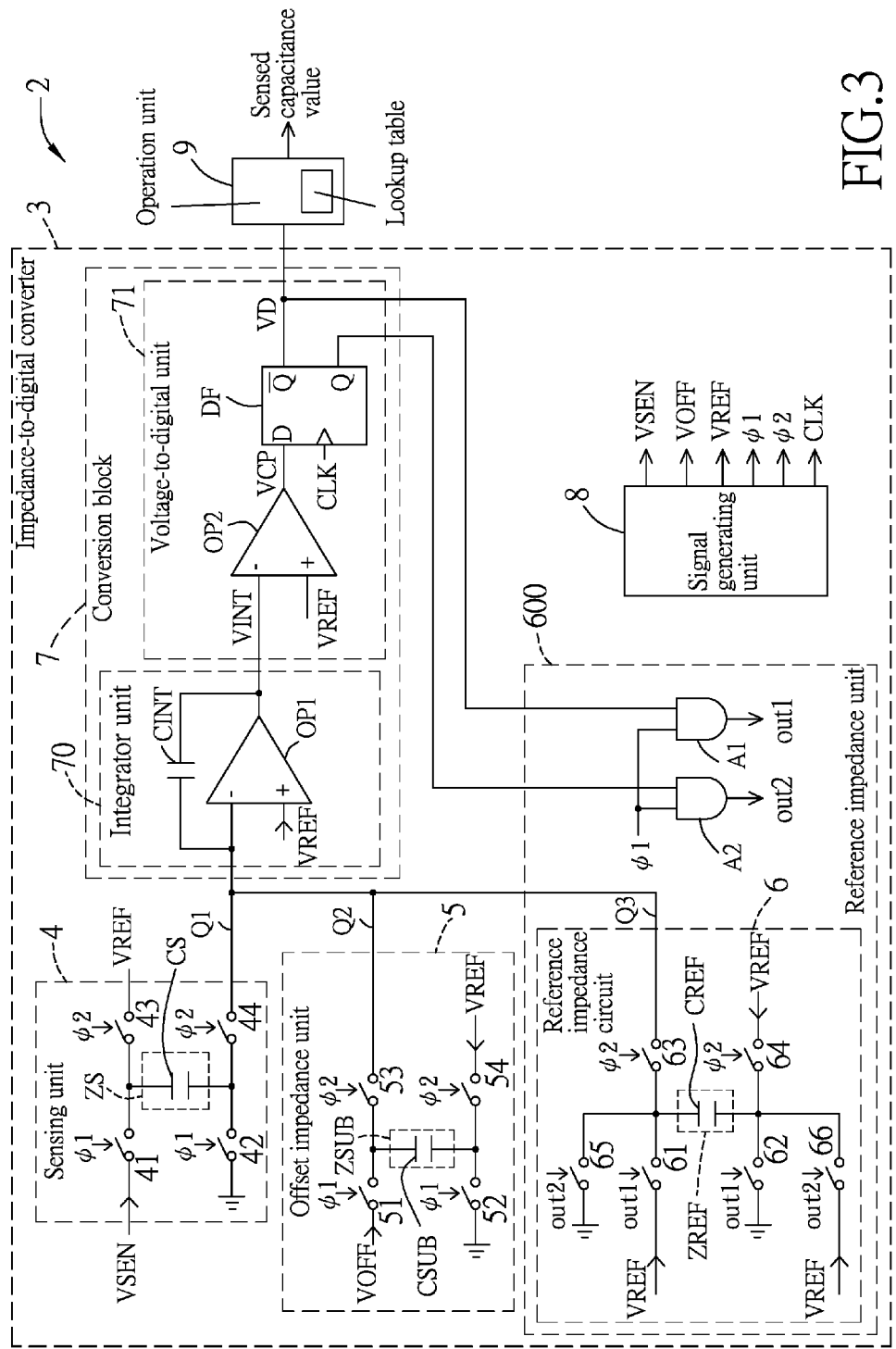
FIG. 3 is a schematic circuit diagram illustrating a first variation of the embodiment.

Referring to FIG. 3, a first variation of the embodiment is shown that the to-be-sensed component (ZS) includes a to-be-sensed capacitor (CS) having the first and second terminals of the to-be-sensed component (ZS), that the offset impedance component (ZSUB) includes an offset capacitor (CSUB), that the reference impedance component (ZREF) includes a reference capacitor (CREF), that the sensing signal includes a sensing voltage (VSEN), that the offset signal includes an offset voltage (VOFF), and that the reference signal includes a reference voltage (VREF).

Figure 4:
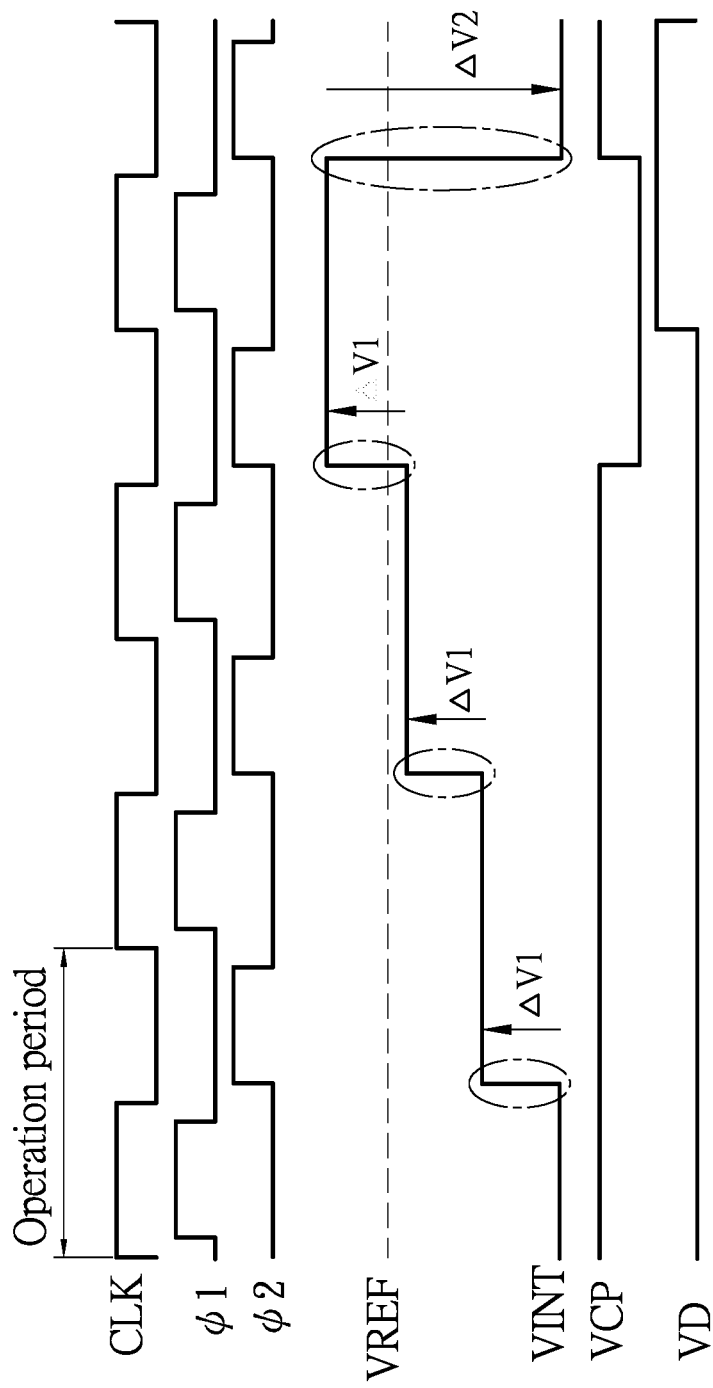
FIG. 4 is a timing diagram of the first variation.

Operations of the embodiment are exemplified using the first variation hereinafter. It is noted that in this disclosure, each of the switches conducts upon receipt of a high voltage level at a control terminal thereof, and does not conduct upon receipt of a low voltage level at the control terminal thereof, but the disclosure is not limited thereto. Referring to FIG. 4, durations where the first control signal (φ1) causes the corresponding switches (e.g., the sensing switches 41, 42) to turn on (i.e., to conduct) do not overlap durations where the second control signal (φ2) causes the corresponding switches (e.g., the sensing switches 43, 44) to turn on, so the sensing switches 41, 42 and the sensing switches 43, 44 do not conduct at the same time. Before the third rising edge of the second control signal (φ2), the comparison signal (VCP) is logic "1", causing the digital signal (VD) to be logic "0", since the integrator voltage (VINT) is lower than the reference voltage (VREF) ; during this time, the reference switches 61, 62 always do not conduct, and the reference switches 65, 66 conduct when the first control signal (φ1) is logic "1". By cooperation of the operations of the reference switches 61-66 and the operational amplifier (OP2) that receives the reference voltage (VREF) at the second input (+) thereof, the integrator voltage (VINT) increases by ΔV1 at every rising edge of the second control signal (φ2) until the integrator voltage (VINT) is greater than the reference voltage (VREF). In FIG. 4, since the integrator voltage (VINT) becomes greater than the reference voltage (VREF) at the third rising edge of the second control signal (φ2), the integrator voltage (VINT) has increased by ΔV1 for three times. It is noted that a number of increments of ΔV1 is associated with a predetermined analog signal received at the second terminal (+) of the operational amplifier (OP2), which is the reference voltage (VREF) in this variation of the embodiment, but this disclosure is not limited thereto. Once the integrator voltage (VINT) is greater than the reference voltage (VREF), the comparison signal (VCP) becomes logic "0", and the digital signal (VD) becomes logic "1" at the next rising edge of the clock signal (CLK). Then, the reference switches 61, 62 conduct when the first control signal (φ1) is logic "1", and the reference switches 65, 66 do not conduct, followed by the integrator voltage (VINT) dropping by ΔV2 at the next rising edge of the second control terminal (φ2), where $$\Delta V1 = V_{SEN} \times \frac{C_{SEN}}{C_{INT}} - V_{OFF} \times \frac{C_{SUB}}{C_{INT}} + V_{REF} \times \frac{C_{REF}}{C_{INT}}$$

$$\Delta V2 = V_{SEN} \times \frac{C_{SEN}}{C_{INT}} - V_{OFF} \times \frac{C_{SUB}}{C_{INT}} - V_{REF} \times \frac{C_{REF}}{C_{INT}}$$

with the parameters defined as follows:
$V_{SEN}$: magnitude of sensing voltage
$V_{OFF}$: magnitude of offset voltage
$V_{REF}$: magnitude of reference voltage
$C_{INT}$: capacitance of integrator capacitor
$C_{SEN}$: capacitance of to-be-sensed capacitor
$C_{SUB}$: capacitance of offset capacitor
$C_{REF}$: capacitance of reference capacitor According to capacitor charge balance, the following equation (1) may be derived based on charge transfer among the to-be-sensed capacitor (CS), the offset capacitor (CSUB), the reference capacitor (CREF) and the integrator capacitor (CINT) within N operation periods (with one cycle of the clock signal (CLK) defining one operation period):

$$N \times C_{SEN} \times V_{SEN} N \times C_{SUB} \times V_{OFF} - Z \times C_{REF} \times V_{REF} + (N-Z) \times C_{REF} \times V_{REF} = 0 \quad (1)$$

with the parameters defined below
N: number of operation periods
Z: number of operation periods that correspond to a predetermined logic level (e.g., logic "1") of digital signal within N operation periods According to equation (1), the series-average value (Z/N) may be derived as follows:

$$\frac{Z}{N} = \frac{C_{SEN} \times V_{SEN} - C_{SUB} \times V_{OFF} + C_{REF} \times V_{REF}}{2 \times C_{REF} \times V_{REF}} \quad (2)$$

Figure 5:
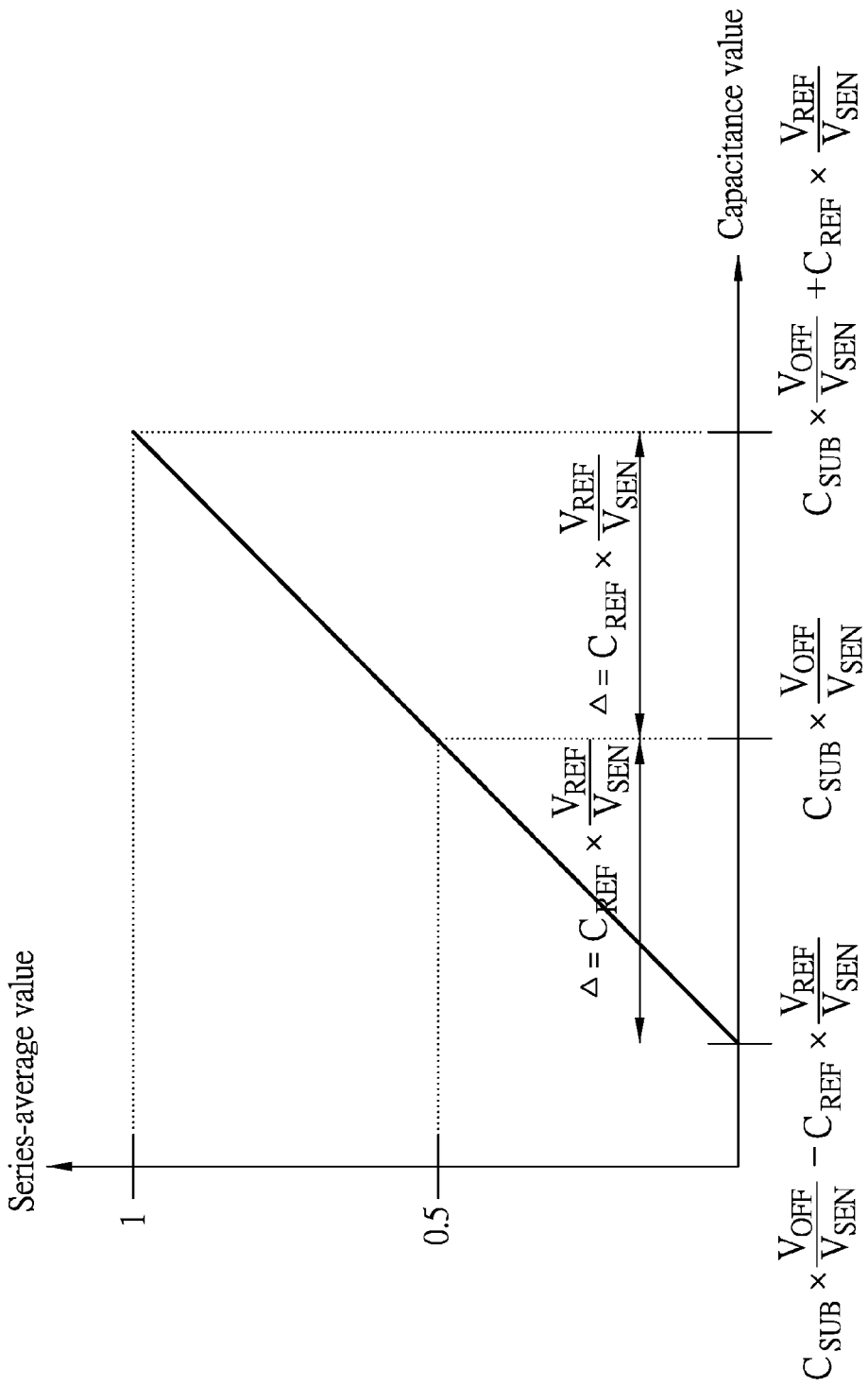
FIG. 5 is a plot illustrating a sensible impedance range of the first variation.

Referring to FIG. 5, a sensible impedance range of the first variation of the embodiment is illustrated by describing a relationship between the series-average value and the corresponding capacitance obtained according to equation (2) (i.e., the sensed impedance value). In practice, the lookup table of the operating unit 9 may be made according to such a relationship. The sensible impedance range may be described as follows:

$$C_{SUB} \times \frac{V_{OFF}}{V_{SEN}} - C_{REF} \times \frac{V_{REF}}{V_{SEN}} \leq C_{SEN} \leq C_{SUB} \times \frac{V_{OFF}}{V_{SEN}} + C_{REF} \times \frac{V_{REF}}{V_{SEN}} \quad (3)$$

According to FIG. 5, it can be seen that a central value of the sensible impedance (capacitance) range is $$C_{SUB} \times \frac{V_{OFF}}{V_{SEN}},$$

that the sensed impedance (capacitance) value has a sensing resolution proportional to $$\frac{V_{SEN}}{V_{REF}},$$

and that the sensed impedance value has a linear relationship with the series-average value (Z/N). Since the number (N) of the operation periods is predetermined, the sensed impedance value has a linear relationship with the number (Z) of the operation periods that correspond to the predetermined logic level of the digital signal within the predetermined number (N) of the operation periods.

Figure 6:
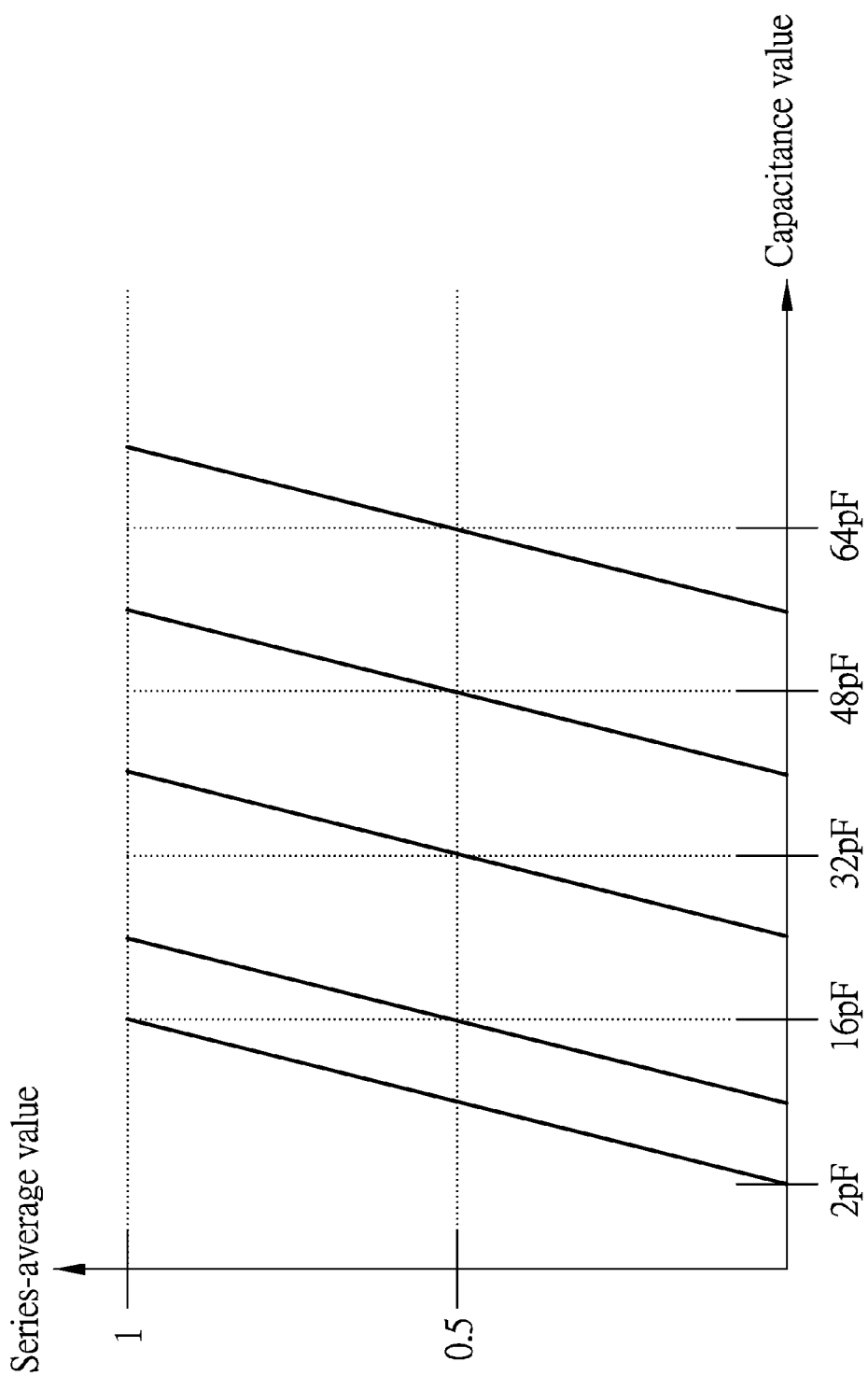
FIG. 6 is a plot illustrating a dynamic sensible impedance range of the first variation.

According to the abovementioned equations, a method for adjustment of the impedance-to-digital converting device 2 according to this disclosure is provided as follows:

1. The central value of the sensible impedance range can be adjusted by using the signal generating unit 8 to change the ratio of the magnitude of the offset signal to the magnitude of the sensing signal (e.g., $V_{OFF}/V_{SEN}$). FIG. 6 illustrates that the central value of the sensible impedance range is dynamically adjustable with a constant sensing resolution of the sensed impedance value.

Figure 7:
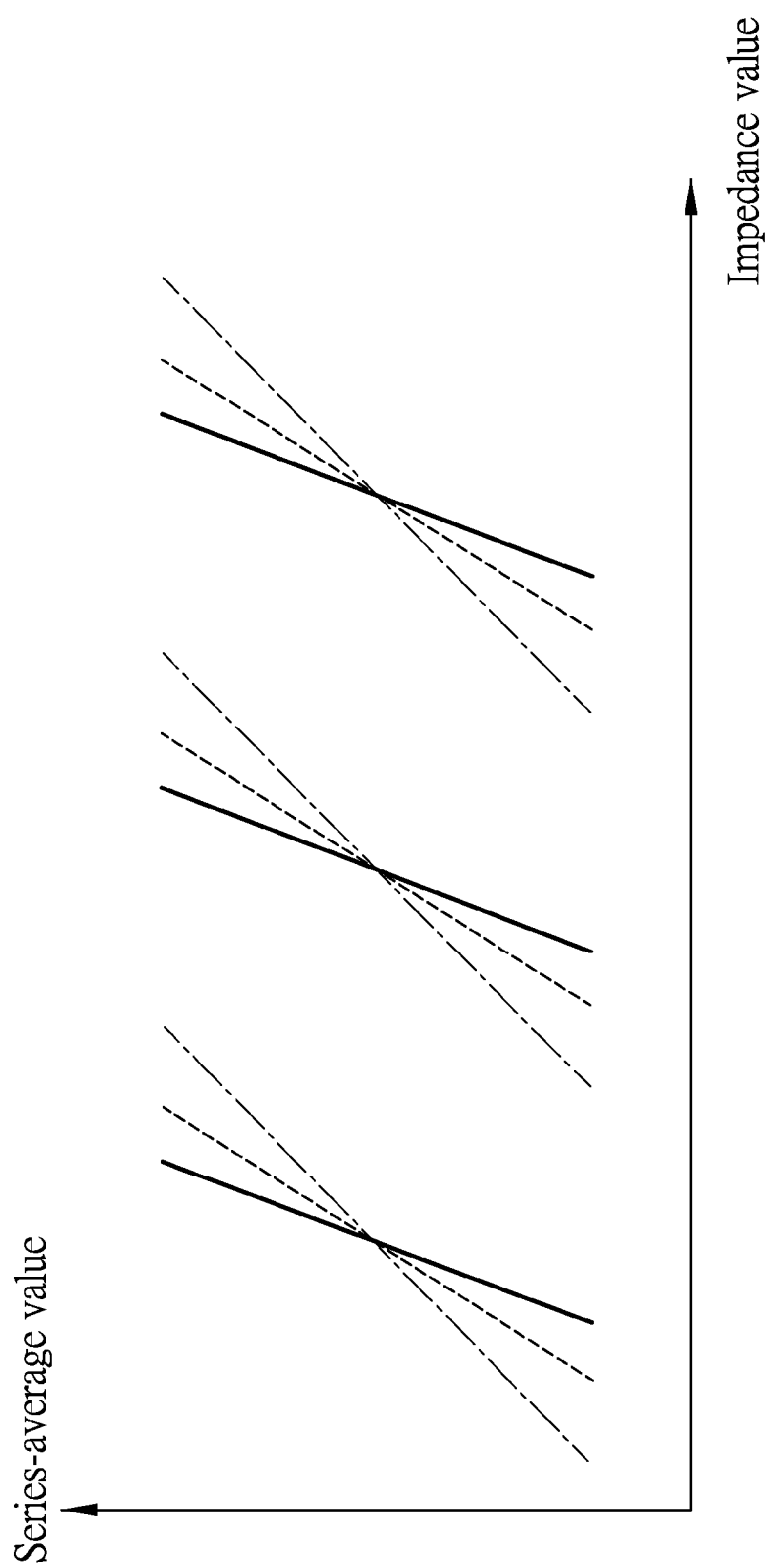
FIG. 7 is a plot illustrating a dynamic sensing resolution of the first variation.

2. The sensing resolution of the sensed impedance value can be adjusted by using the signal generating unit 8 to change the ratio of the magnitude of the sensing signal to the magnitude of the reference signal (e.g., $V_{SEN}/V_{REF}$). FIG. 7 illustrates that both of the sensing resolution of the sensed impedance value and the central value of the sensible impedance range are dynamically adjustable.

Figure 8:
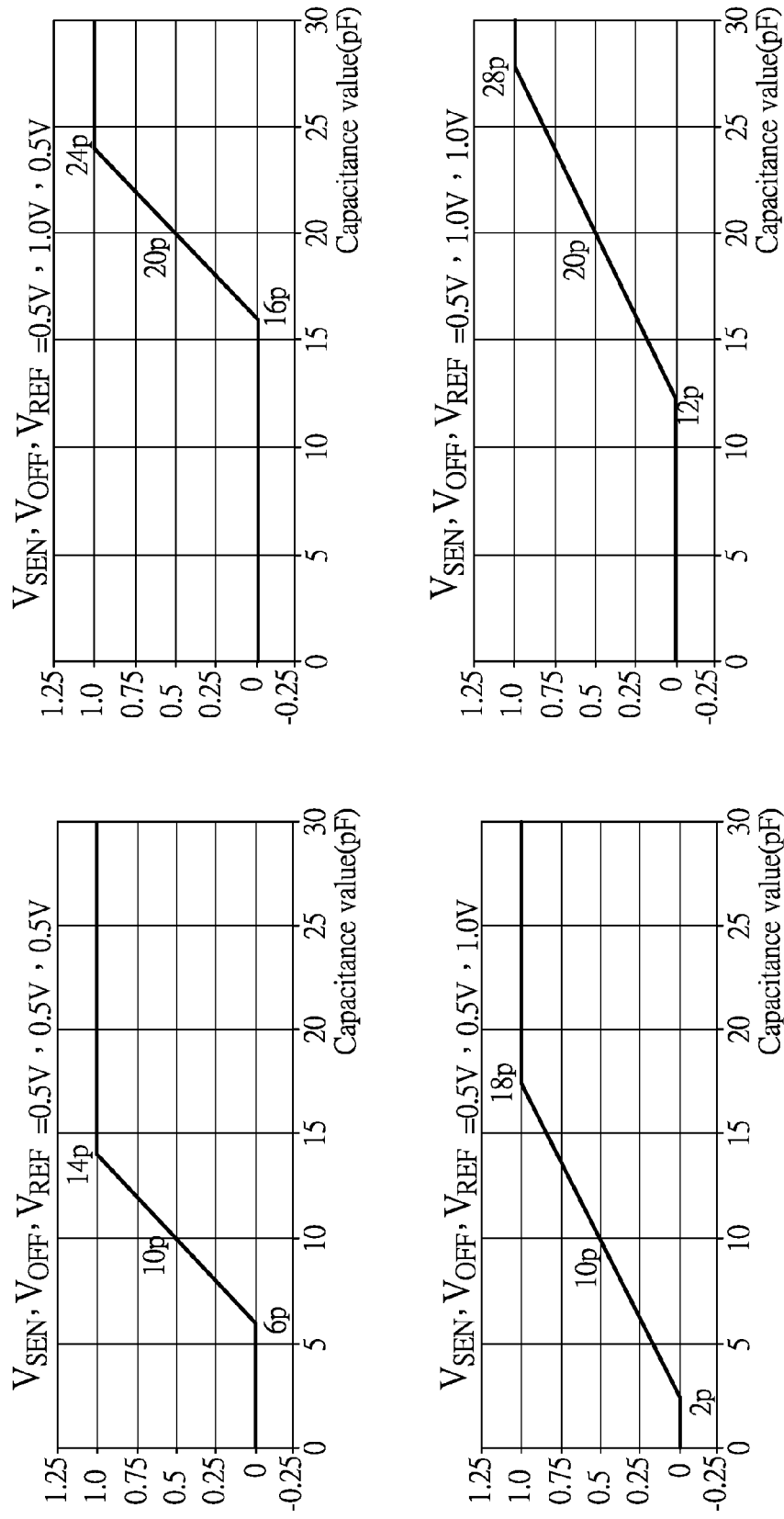
FIGS. 8 and 9 are plots illustrating simulation results of the first variation.
Figure 9:
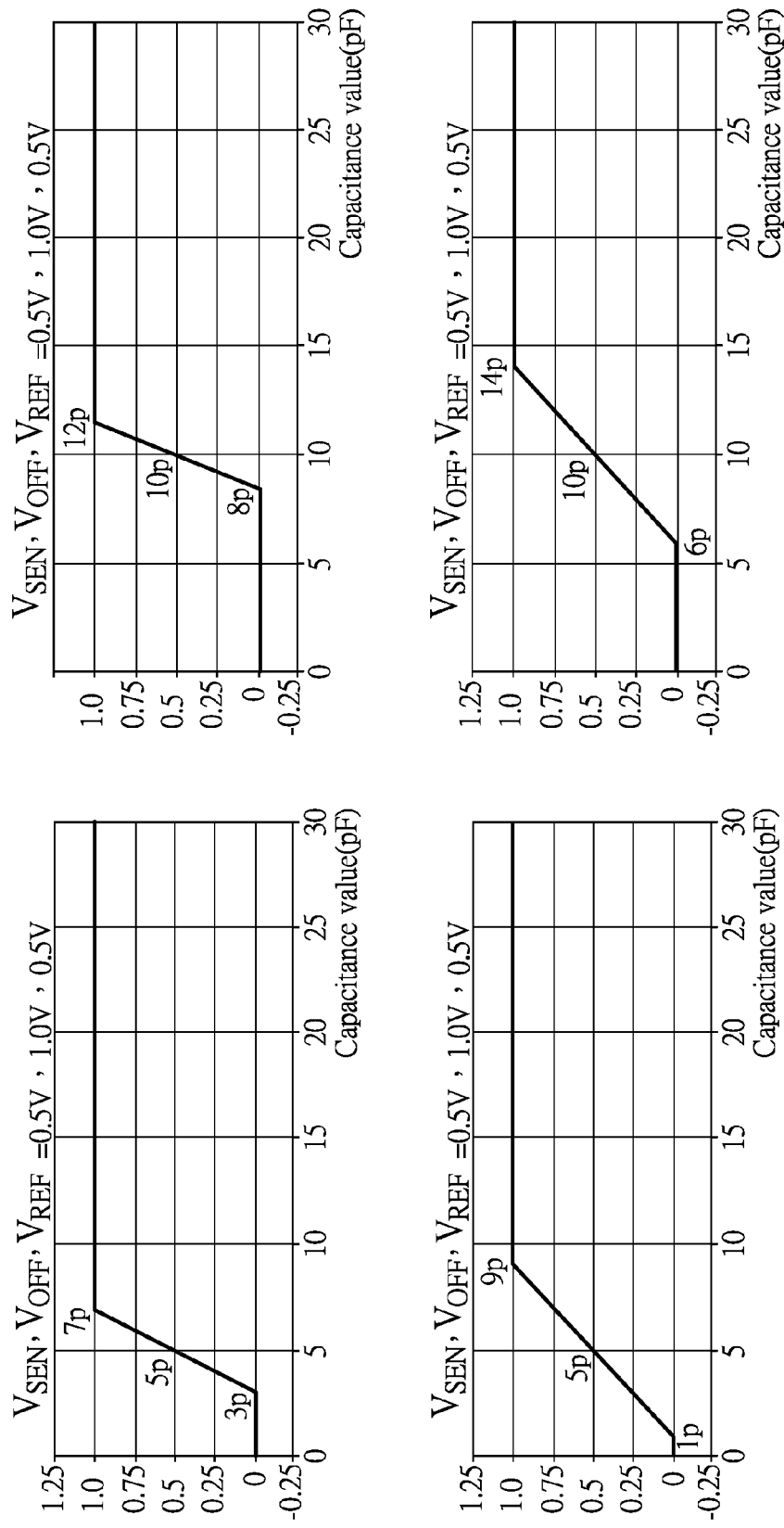

FIGS. 8 and 9 show simulation results of the sensible impedance range of the first variation of the embodiment with different combinations of the sensing signal ($V_{SEN}$), the offset signal ($V_{OFF}$) and the reference signal ($V_{REF}$).

Figure 10:
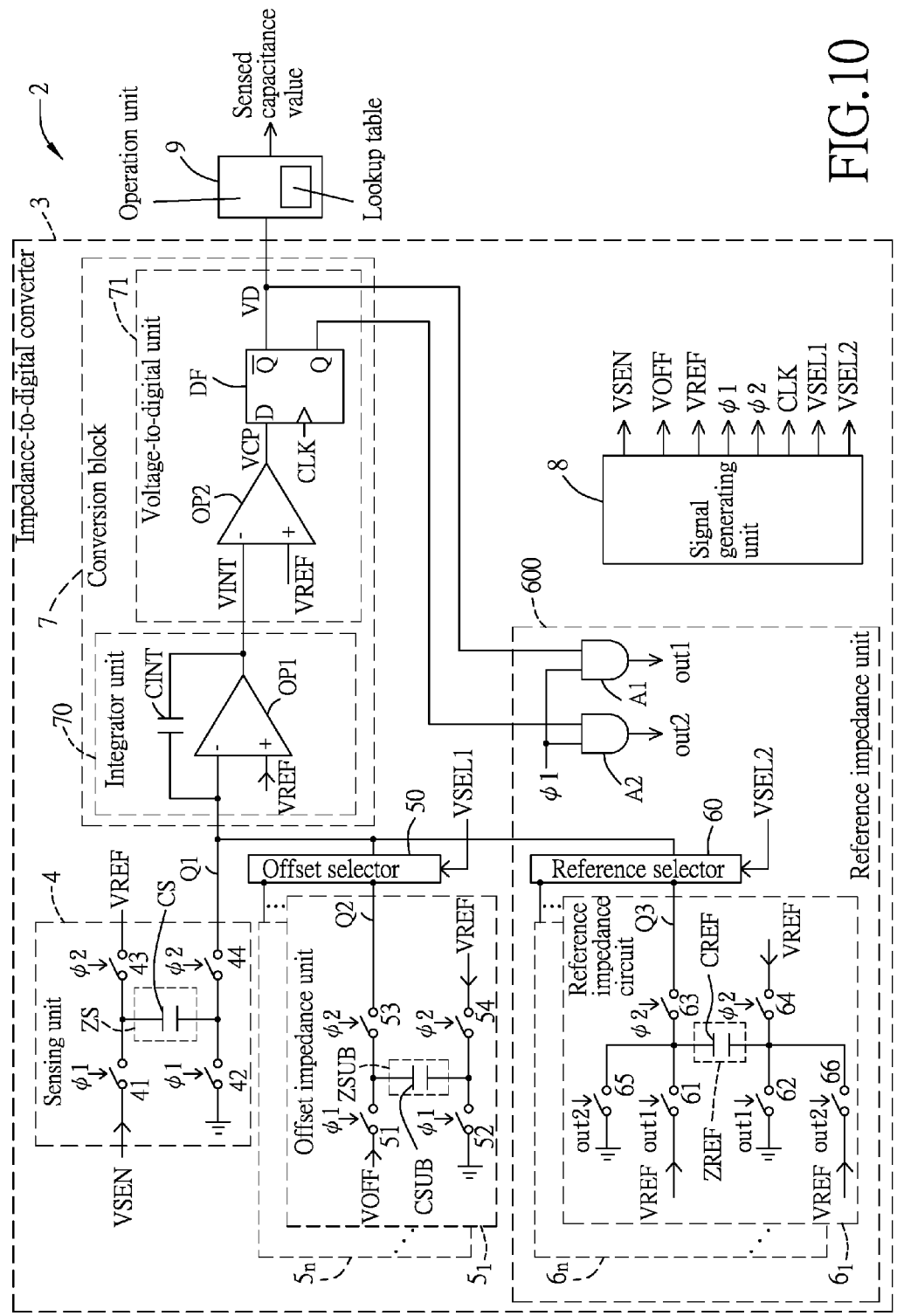
FIG. 10 is a schematic circuit diagram illustrating a second variation of the embodiment.

Referring to FIG. 10, a second variation of the embodiment is shown to be similar to the first variation, and differs from the first variation in that, the second variation includes a plurality of the offset impedance units $5_1$-$5_n$, a plurality of the reference impedance circuits $6_1$-$6_n$, an offset selector 50 and a reference selector 60.

In this variation, each of the offset impedance units $5_1$-$5_n$ has a configuration the same as that of the offset impedance unit 5 of the first variation, and each of the reference impedance units $6_1$-$6_n$ has a configuration the same as that of the reference impedance unit 6 of the first variation.

The offset selector 50 has a plurality of inputs respectively coupled to the first terminals of the offset switches 53 of the offset impedance units $5_1$-$5_n$ for receiving the second electric charges (Q2) therefrom, and an output coupled to the integrator unit 70. The offset selector 50 selectively provides at least one of the second electric charges (Q2) to the integrator unit 70.

The reference selector 60 has a plurality of inputs respectively coupled to the first terminals of the reference switches 63 of the reference impedance circuits $6_1$-$6_n$ for receiving the third electric charges (Q3) therefrom, and an output coupled to the integrator unit 70. The reference selector 60 selectively provides at least one of the third electric charges (Q3) to the integrator unit 70.

By virtue of the abovementioned configuration, equivalent capacitance of the offset capacitors (CSUB) maybe changed by using the offset selector 50 to select a desired number of the offset impedance units $5_1$-$5_n$ to provide the second electric charges (Q2) to the integrator unit 70, and equivalent capacitance of the reference capacitors (CREF) maybe changed by using the reference selector 60 to select a desired number of the reference impedance circuits $6_1$-$6_n$ to provide the third electric charges (Q3) to the integrator unit 70. According to relationship (3), it is known that, in this variation, the central value of the sensible impedance range may be adjusted by changing the equivalent capacitance of the offset capacitors (CSUB), and the sensing resolution of the sensed impedance value may be adjusted by changing the equivalent capacitance of the reference capacitors (CREF). In this variation, the user may use the signal generating unit 8 to generate an offset select signal (VSEL1) to control selection of the offset selector 50, and a reference select signal (VSEL2) to control selection of the reference selector 60.

Thus, for this variation, the method for adjustment of the impedance-to-digital converting device 2 according to this disclosure is further provided as follows:

3. The central value of the sensible impedance range can be adjusted by using the signal generating unit 8 to change the offset select signal (VSEL1) for adjusting a number of the second electric charges (Q2) to be provided to the integrator unit 70 (i.e., adjusting the equivalent capacitance of the offset capacitors (CSUB)).

4. The sensed impedance value can be adjusted by using the signal generating unit 8 to change the reference select signal (VSEL2) for adjusting a number of the third electric charges (Q3) to be provided to the integrator unit 70 (i.e., adjusting the equivalent capacitance of the reference capacitors (CREF)).

Figure 11:
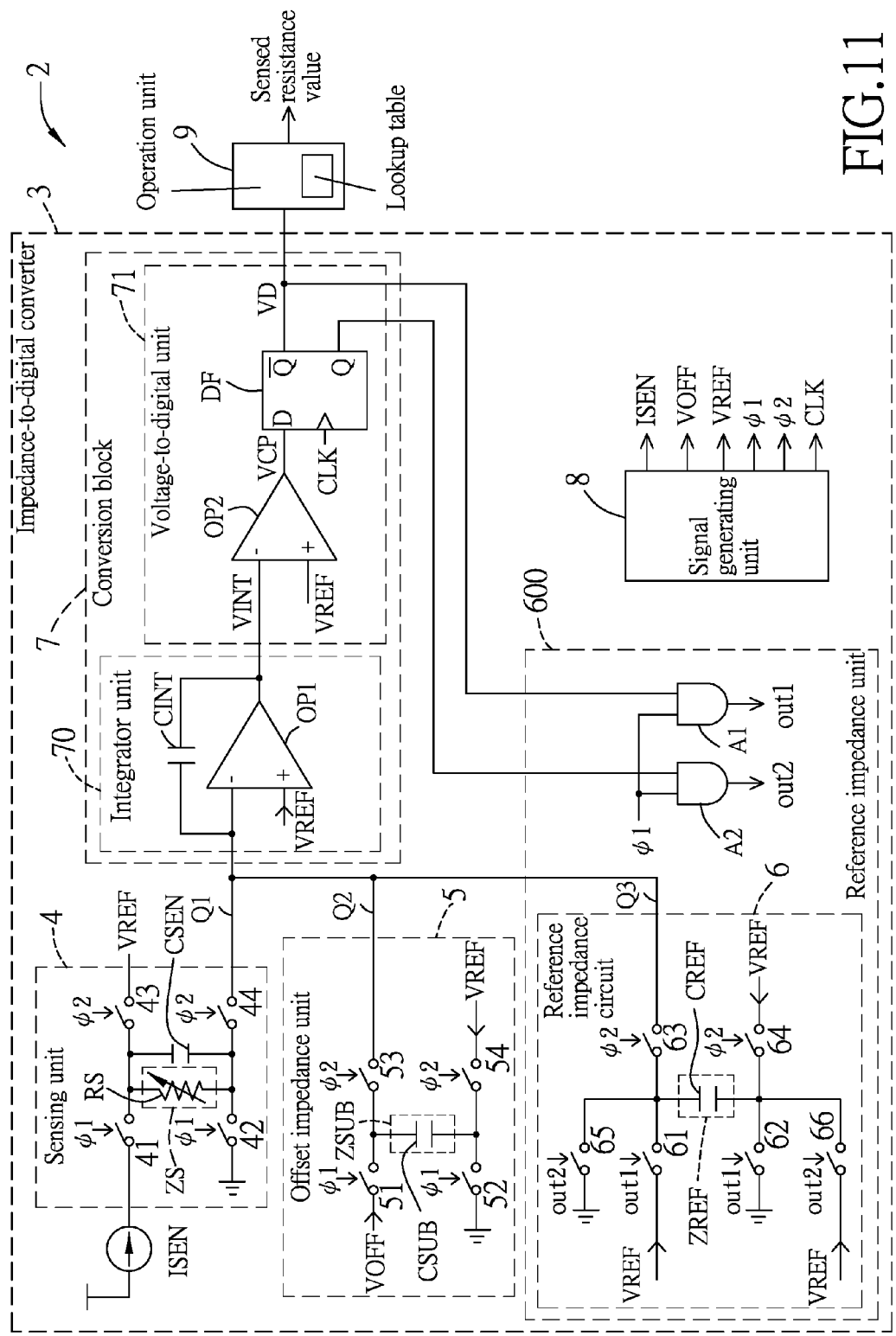
FIG. 11 is a schematic circuit diagram illustrating a third variation of the embodiment.

Referring to FIG. 11, a third variation of the embodiment is shown to be similar to the first variation, and differs from the first variation in that the to-be-sensed component (ZS) is characterized as a resistor and includes a to-be-sensed resistor (RS) having the first and second terminals of the to-be-sensed component (ZS), and in the third variation, the sensing signal includes a sensing current (ISEN), and the sensing unit 4 further includes a sensing capacitor (CSEN) coupled to the to-be-sensed resistor (RS) in parallel. It is noted that the sensing capacitor (CSEN) may be either an internal capacitor of the impedance-to-digital converting device 2, or an external capacitor with respect to the impedance-to-digital converting device 2.

Figure 12:
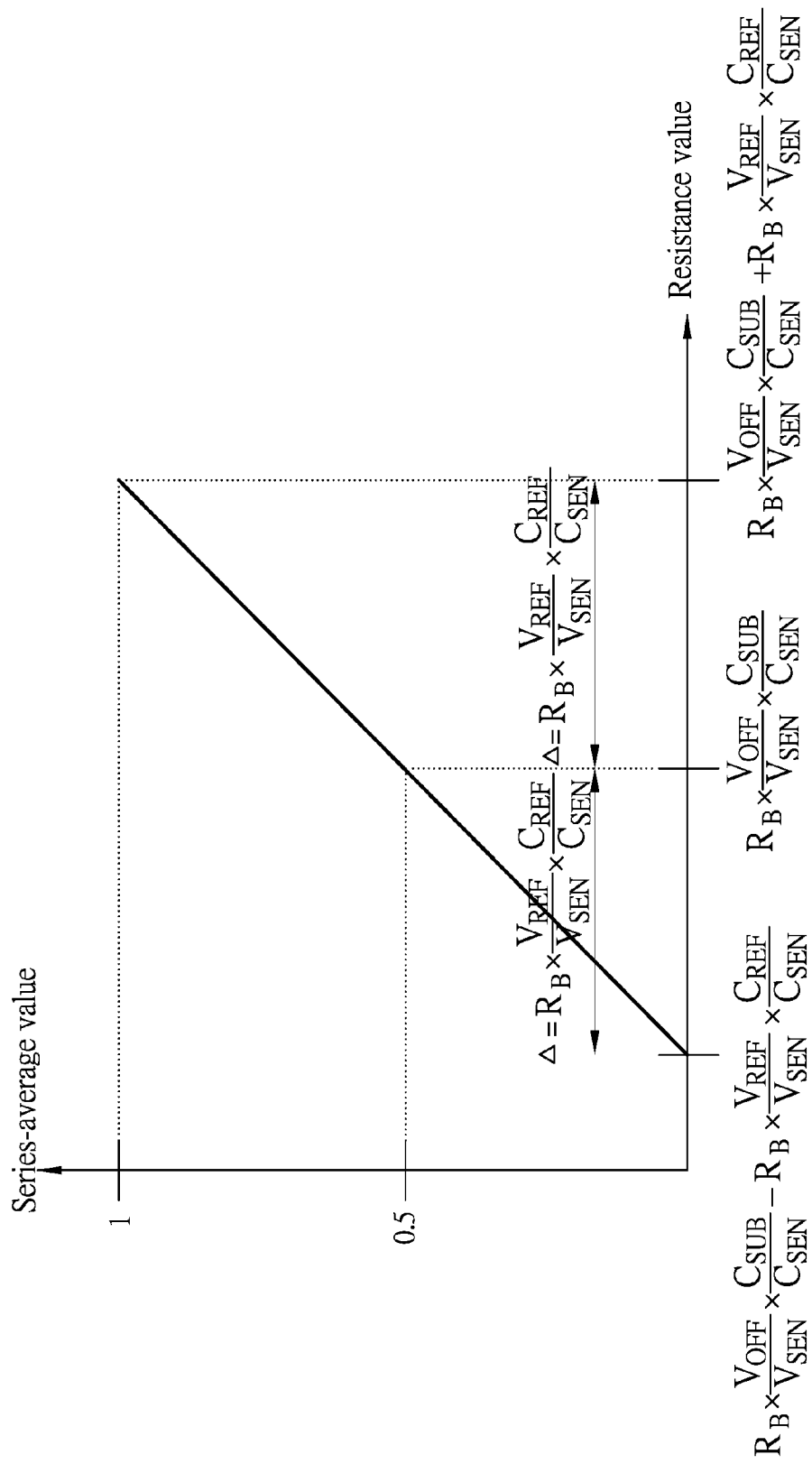
FIG. 12 is a plot illustrating a sensible impedance range of the third variation.

Referring to FIG. 12, according to capacitor charge balance, a sensible impedance range of the third variation is shown to be:

$$\frac{C_{SUB}}{C_{SEN}} \times \frac{V_{OFF}}{I_{SEN}} - \frac{C_{REF}}{C_{SEN}} \times \frac{V_{REF}}{I_{SEN}} \leq \qquad (4)$$

$$R_{SEN} \leq \frac{C_{SUB}}{C_{SEN}} \times \frac{V_{OFF}}{I_{SEN}} + \frac{C_{REF}}{C_{SEN}} \times \frac{V_{REF}}{I_{SEN}}$$

with the parameters defined as follows:
$R_{SEN}$: resistance of to-be-sensed resistor
$I_{SEN}$: magnitude of sensing current
$V_{OFF}$: magnitude of offset voltage
$V_{REF}$: magnitude of reference voltage
$C_{SEN}$: capacitance of sensing capacitor
$C_{SUB}$: capacitance of offset capacitor
$C_{REF}$: capacitance of reference capacitor It is known from the above relationship that a central value of the sensible impedance range of the third variation is $$\frac{C_{SUB}}{C_{SEN}} \times \frac{V_{OFF}}{I_{SEN}},$$

and a sensing resolution of the sensed impedance value is proportional to $$\frac{I_{SEN}}{V_{REF}}.$$

Furthermore, since the sensing current ($I_{SEN}$) maybe represented in terms of a relationship between a sensing voltage ($V_{SEN}$) and an internal resistance ($R_B$) of the signal generating unit 8, i.e., $$I_{SEN} = \frac{V_{SEN}}{R_B},$$

relationship (4) can also be represented as:

$$\frac{C_{SUB}}{C_{SEN}} \times \frac{V_{OFF}}{V_{SEN}} \times R_B - \frac{C_{REF}}{C_{SEN}} \times \frac{V_{REF}}{V_{SEN}} \times R_B \leq$$

$$R_{SEN} \leq \frac{C_{SUB}}{C_{SEN}} \times \frac{V_{OFF}}{V_{SEN}} \times R_B + \frac{C_{REF}}{C_{SEN}} \times \frac{V_{REF}}{V_{SEN}} \times R_B$$

In other words, the sensible impedance range (or the sensing resolution of the sensed impedance value) may be adjusted by changing $V_{SEN}$, and is not limited by $R_B$.

Figure 13:
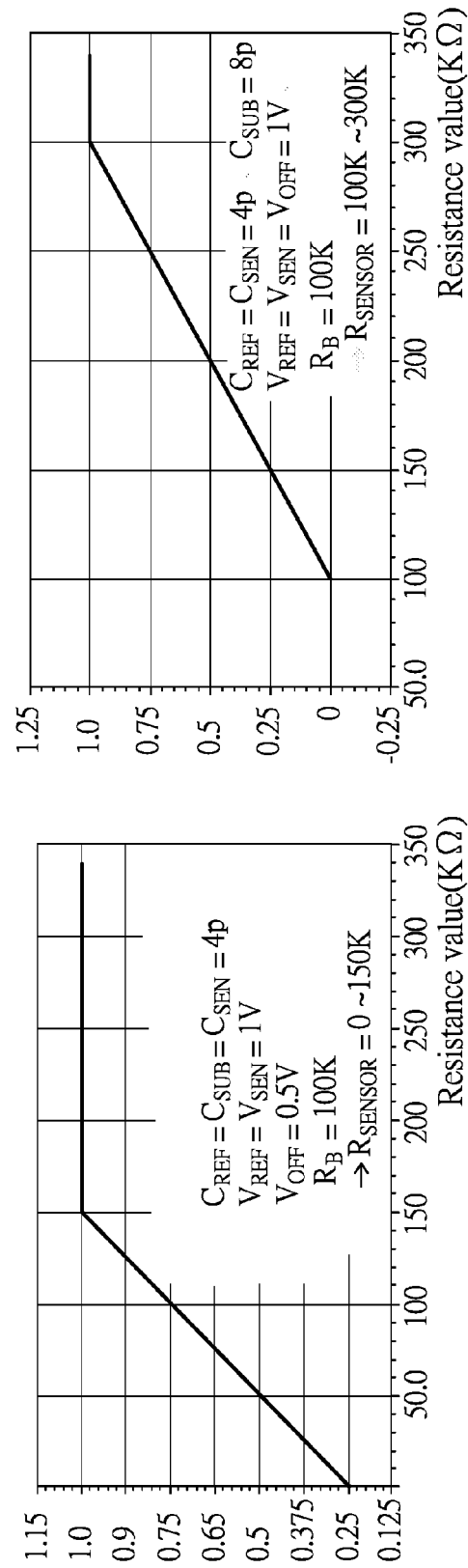
FIG. 13 shows a plot illustrating simulation results of the second variation.

In practice, the user may first use appropriate parameter settings of $R_B$, $C_{SUB}$, $C_{SFN}$, $C_{REF}$, $V_{SEN}$, $V_{OFF}$ and $V_{REF}$ to perform sensing with a wider sensible impedance range to obtain a rough impedance value of the to-be-sensed component (ZS). Then, the user may shift the central value of the sensible impedance range according to the rough impedance value, and narrow down the sensible impedance range to achieve a higher resolution of the sensed impedance value by changing the abovementioned parameter setting. Accordingly, this disclosure may achieve an effective wider sensible impedance range while maintaining a high sensing resolution of the sensing result with limited chip area. FIG. 13 shows simulation results of the sensible impedance range ($R_{SENSOR}$) of the third variation with different $V_{SEN}$ and $C_{SUB}$.

Figure 14:
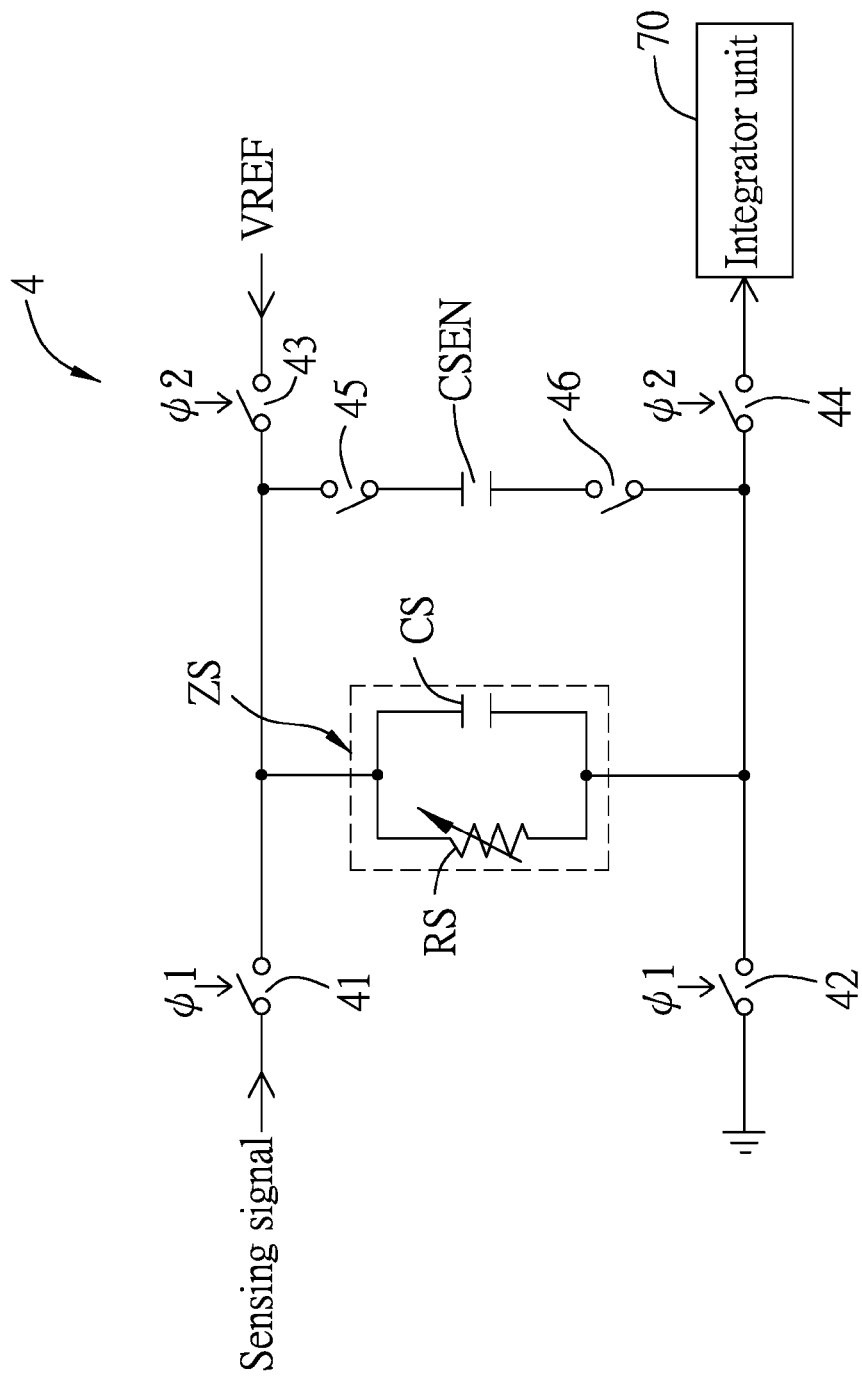
FIG. 14 is a schematic circuit diagram illustrating a variation of a sensing unit of the embodiment.

Referring to FIG. 14, a variation of the sensing unit 4 of the embodiment is shown to be similar to that shown in FIG. 2, and differs therefrom in that this variation is adapted to sense a to-be-sensed component (ZS) having composite impedance (e.g., resistance and capacitance). In this variation, the to-be-sensed component (ZS) includes a resistor (RS) and a capacitor (CS) that are coupled in parallel between the first and second terminals thereof, and the sensing unit 4 further includes a sensing switch 45, a sensing capacitor (CSEN) and a sensing switch 46 that are coupled in series in the given order between the first and second terminals of the to-be-sensed component (ZS). When the resistance part (i.e., the resistor (RS)) is to be sensed, the sensing capacitor (CSEN) is required, and thus the sensing switches 45, 46 are switched to be conducting. On the other hand, the sensing capacitor (CSEN) is not required when the capacitance part (i.e., the capacitor (CS)) is to be sensed, and thus the sensing switches 45, 46 are switched to be not conducting. Accordingly, the composite impedance of the to-be-sensed component (ZS) can be completed.

Figure 15:
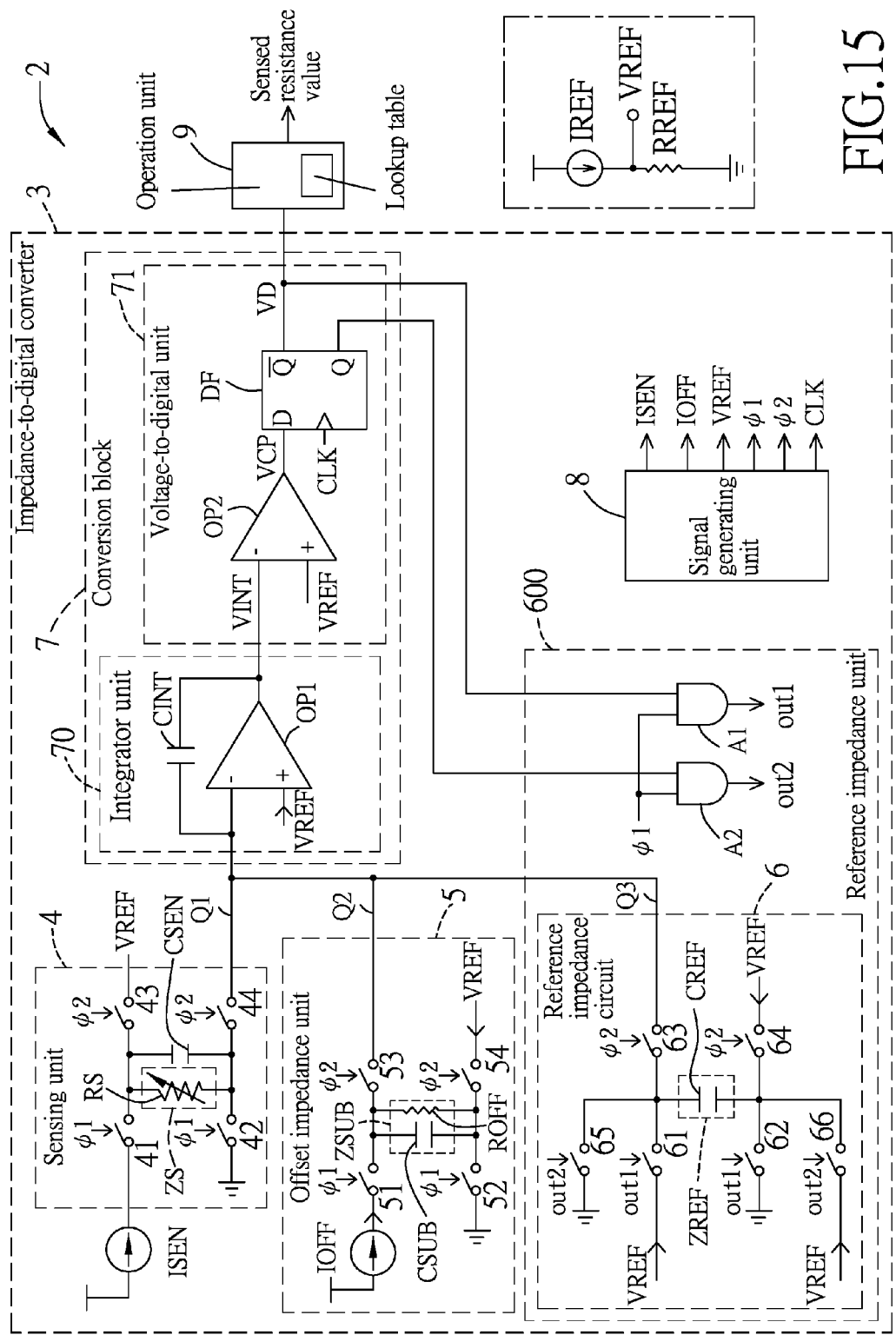
FIG. 15 is a schematic circuit diagram illustrating a fourth variation of the embodiment.

Referring to FIG. 15, a fourth variation of the embodiment is shown to be similar to the third variation, and differs from the third variation in that the offset signal includes an offset current (IOFF), and the offset impedance component (ZSUB) of the offset impedance unit 5 further includes an offset resistor (ROFF) coupled to the offset capacitor (CSUB) in parallel.

When the sensing unit 4 receives the sensing current (ISEN), the sensing current (ISEN) flows through the to-be-sensed resistor (RS) to form a voltage ($V_{SEN}=I_{SEN} \times R_{SEN}$), where $I_{SEN}$ represents a magnitude of the sensing current (ISEN), and $R_{SEN}$ represents resistance of the to-be-sensed resistor (RS)) that is stored in the sensing capacitor (CSEN) and that is functionally equivalent to the sensing voltage (VSEN) of the first variation.

When the offset impedance unit 5 receives the offset current (IOFF), the offset current (IOFF) flows through the offset resistor (ROFF) to form a voltage ($V_{OFF}=I_{OFF} \times R_{OFF}$) where $I_{OFF}$ represents a magnitude of the offset current (IOFF), and $R_{OFF}$ represents resistance of the offset resistor (ROFF)) that is stored in the offset capacitor (CSUB) and that is functionally equivalent to the offset voltage (VOFF) of the third variation.

In a similar manner, the reference voltage (VREF) may be generated by a reference current (IREF) flowing through a reference resistor (RREF).

Figure 16:
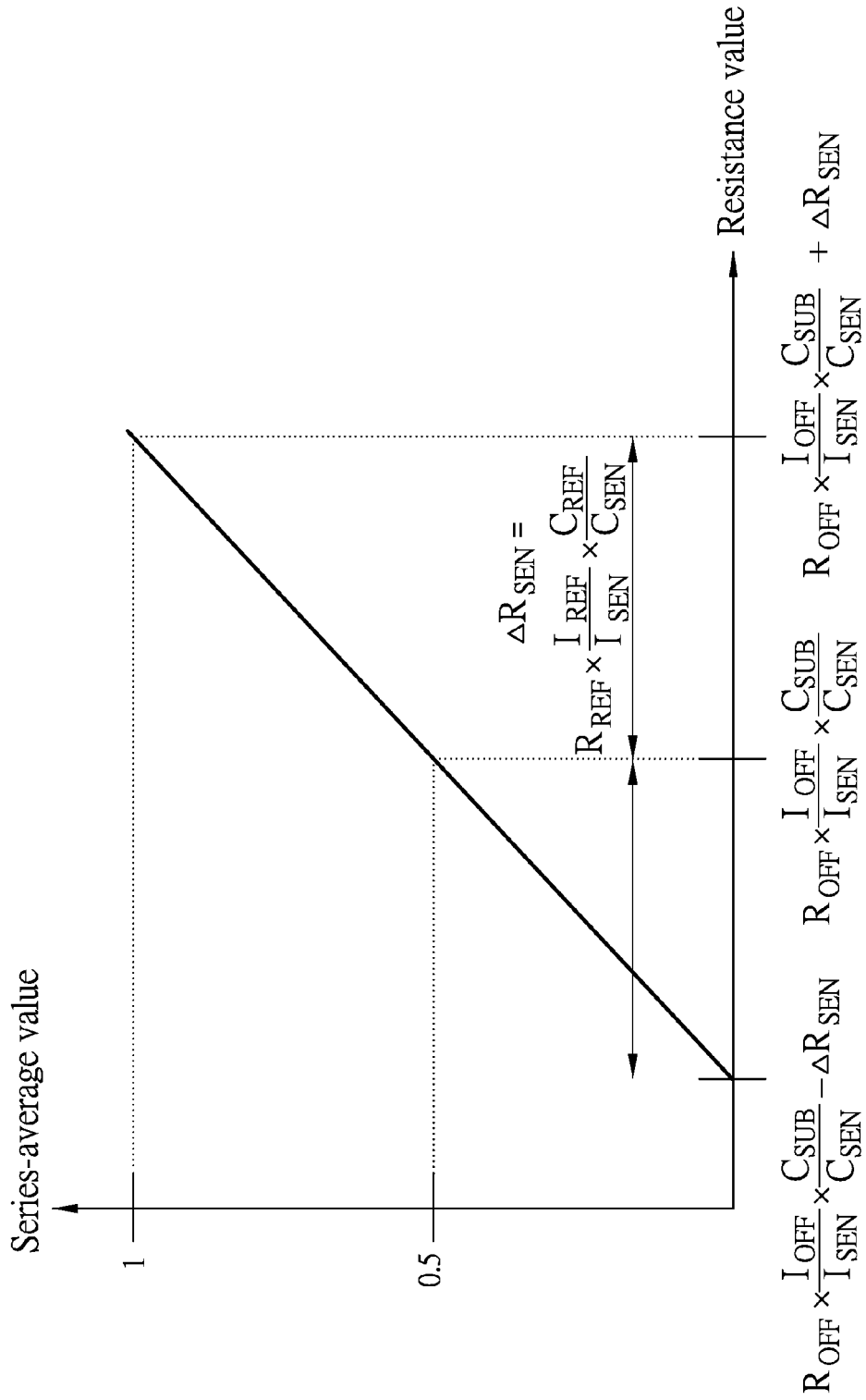
FIG. 16 is a plot illustrating a sensible impedance range of the fourth variation.

Referring to FIG. 16, according to capacitor charge balance, a sensible impedance range of the fourth variation is shown to be:

$$\frac{C_{SUB}}{C_{SEN}} \times \frac{I_{OFF}}{I_{SEN}} \times R_{OFF} - \Delta R_{SEN} \leq R_{SEN} \leq \frac{C_{SUB}}{C_{SEN}} \times \frac{I_{OFF}}{I_{SEN}} \times R_{OFF} + \Delta R_{SEN}$$

-continued $$\Delta R_{SEN} = \frac{C_{REF}}{C_{SEN}} \times \frac{I_{REF}}{I_{SEN}} \times R_{REF}$$

with the parameters defined as follows:
$R_{SEN}$: resistance of to-be-sensed resistor
$R_{OFF}$: resistance of offset resistor
$R_{REF}$: resistance of reference resistor
$I_{SEN}$: magnitude of sensing current
$I_{OFF}$: magnitude of offset current
$I_{REF}$: magnitude of reference current
$C_{SEN}$: capacitance of sensing capacitor
$C_{SUB}$: capacitance of offset capacitor
$C_{REF}$: capacitance of reference capacitor In summary, the disclosure may have the following advantages:

1. The central value of the sensible impedance (including resistance and capacitance) range and the sensing resolution of the sensed impedance value are both adjustable, thereby achieving an effective wider sensible impedance range while maintaining a high sensing resolution of the sensed impedance value.

2. The sensible impedance range may be shifted as desired by changing the ratio of the magnitude of the offset signal to the magnitude of the sensing signal, where each of the offset signal and the sensing signal may be either a voltage signal or a current signal.

3. The sensing resolution of the sensed impedance value may be adjusted by changing the ratio of the magnitude of the sensing signal to the magnitude of the reference signal, where each of the reference signal and the sensing signal may be either a voltage signal or a current signal.

4. The sensible impedance range is not limited by internal resistance of the chip.

5. Impedance-to-digital conversion implemented by the disclosed architecture may cover both of capacitance-to-digital conversion and resistance-to-digital conversion.

6. Applicable products of the disclosed impedance-to-digital converting device may be significantly promoted. Capacitance sensing has a variety of applications, such as accelerometers, pressure meters, humidity meters, wearable devices, etc., with different requirements for the sensible impedance range and the sensing resolution. The sensible impedance range and the sensing resolution of the disclosed impedance-to-digital converting device are both adjustable by changing magnitudes of signal, thereby being suited to a variety of applications.

7. This disclosure may be applied to a wearable device market. Health and fitness are the primarily desired functions for wearable devices, so health-related sensing devices, such as pulsemeter, pulse oximeter, skin moisture sensors, etc., are important to the wearable device market. Environmental sensors, such as sensors for temperature, humidity, ultraviolet, gas (e.g., carbon monoxide), have high market potential. While doing exercise, microphones (voice sensors) may be used to transmit user's instructions, and motion sensors maybe used to achieve posture control. Accelerometers, gyroscopes, MEMS microphones and pulse sensors may be implemented into smartwatches. More and more wearable devices implement the abovementioned applications, thereby leading to high potential of the disclosure in the wearable device market.

8. Since the sensible impedance range and the sensing resolution of the disclosure may be adjusted for different applications, high integrity may be achieved, thereby reducing cost of products.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An impedance-to-digital converter for sensing an impedance value of a to-be-sensed component, said impedance-to-digital converter comprising:
    a sensing unit to be coupled to the to-be-sensed component, disposed to receive a sensing signal, and configured to periodically convert the sensing signal into a first electric charge by providing, within every operation period of said impedance-to-digital converter, the sensing signal to the to-be-sensed component, an amount of the first electric charge being proportional to a magnitude of the sensing signal;
    an offset impedance unit disposed to receive an offset signal, and configured to convert the offset signal into a second electric charge every operation period of said impedance-to-digital converter, an amount of the second electric charge being proportional to a magnitude of the offset signal;
    a reference impedance unit disposed to receive a reference signal and a digital signal, and including a reference impedance circuit configured to convert the reference signal into a third electric charge every operation period of said impedance-to-digital converter, an amount of the third electric charge being proportional to a magnitude of the reference signal, a polarity of the third electric charge being associated with a logic level of the digital signal; and
    a conversion block receiving the first electric charge, the second electric charge and the third electric charge that are respectively outputted by said sensing unit, said offset impedance unit and said reference impedance unit to cooperatively form a resultant electric charge, and configured to convert the resultant electric charge into the digital signal;
    wherein the impedance value sensed by said impedance-to-digital converter has a linear relationship with a number of the operation periods that correspond to a predetermined logic level of the digital signal among a predetermined number of the operation periods;
    wherein a central value of a sensible impedance range of said impedance-to-digital converter is proportional to a ratio of a magnitude of the offset signal to a magnitude of the sensing signal;
    wherein the sensing signal, the offset signal and the reference signal are independent from each other.

2. The impedance-to-digital converter of claim 1, wherein the impedance value sensed by said impedance-to-digital converter has a sensing resolution proportional to a ratio of the magnitude of the sensing signal to a magnitude of the reference signal.

3. The impedance-to-digital converter of claim 2, the to-be-sensed component having a first terminal and a second terminal, wherein said sensing unit includes:
    a first sensing switch disposed to receive a first control signal, and to introduce the sensing signal to the first terminal of the to-be-sensed component when conducting, and configured to conduct or not conduct according to the first control signal;
    a second sensing switch disposed to receive the first control signal, and to couple the second terminal of the to-be-sensed component to ground when conducting, and configured to conduct or not conduct according to the first control signal;
    a third sensing switch disposed to receive a second control signal, and to introduce the reference signal to the first terminal of the to-be-sensed component when conducting, and configured to conduct or not conduct according to the second control signal; and
    a fourth sensing switch disposed to receive the second control signal, having a first terminal at which the first electric charge is outputted when said fourth sensing switch is conducting, and a second terminal to be coupled to the second terminal of the to-be-sensed component, and configured to establish or not establish connection between said first and second terminals thereof to be conducting or non-conducting according to the second control signal;
    wherein said first sensing switch and said third sensing switch do not conduct at the same time.

4. The impedance-to-digital converter of claim 3, wherein said offset impedance unit includes:
    an offset capacitor having a first terminal and a second terminal;
    a first offset switch disposed to receive the first control signal, to introduce the offset signal to said first terminal of said offset capacitor when conducting, and configured to conduct or not conduct according to the first control signal;
    a second offset switch disposed to receive the first control signal, to couple said second terminal of said offset capacitor to ground when conducting, and configured to conduct or not conduct according to the first control signal;
    a third offset switch disposed to receive the second control signal, having a first terminal at which the second electric charge is outputted when said third offset switch is conducting, a second terminal coupled to said first terminal of said offset capacitor, and configured to establish or not establish connection between said first and second terminals thereof to be conducting or non-conducting according to the second control signal; and
    a fourth offset switch disposed to receive the second control signal, to introduce the reference signal to said second terminal of said offset capacitor when conducting, and configured to conduct or not conduct according to the second control signal.

5. The impedance-to-digital converter of claim 3, wherein said voltage-to-digital unit is further configured to generate an inverted digital signal that is complementary to the digital signal, and said reference impedance unit further includes:

a first AND gate configured to perform AND operation on the digital signal and the first control signal so as to generate a first operation signal; and a second AND gate configured to perform AND operation on the inverted digital signal and the first control signal so as to generate a second operation signal;

wherein said reference impedance circuit includes:

a reference capacitor having a first terminal and a second terminal;

a first reference switch coupled to said first AND gate to receive the first operation signal therefrom, disposed to introduce the reference signal to said first terminal of said reference capacitor when conducting, and configured to conduct or not conduct according to the first operation signal;

a second reference switch coupled to said first AND gate to receive the first operation signal therefrom, disposed to couple said second terminal of said reference capacitor to ground when conducting, and configured to conduct or not conduct according to the first operation signal;

a third reference switch disposed to receive the second control signal, having a first terminal at which the third electric charge is outputted when said third reference switch is conducting, and a second terminal coupled to said first terminal of said reference capacitor, and configured to establish or not establish connection between said first and second terminals thereof to be conducting or non-conducting according to the second control signal;

a fourth reference switch disposed to receive the second control signal, to introduce the reference signal to said second terminal of said reference capacitor when conducting, and configured to conduct or not conduct according to the second control signal;

a fifth reference switch coupled to said second AND gate to receive the second operation signal therefrom, disposed to couple said first terminal of said reference capacitor to ground when conducting, and configured to conduct or not conduct according to the second operation signal; and a sixth reference switch coupled to said second AND gate to receive the second operation signal therefrom, disposed to introduce the reference signal to said second terminal of said reference capacitor when conducting, and configured to conduct or not conduct according to the second operation signal.

6. The impedance-to-digital converter of claim 3, comprising a plurality of said offset impedance units, and further comprising an offset selector having a plurality of inputs respectively coupled to said offset impedance units for receiving the second electric charges therefrom, and an output coupled to said conversion block, wherein said offset selector is configured to selectively provide at least one of the second electric charges to said conversion block.

7. The impedance-to-digital converter of claim 3, wherein said reference impedance unit includes a plurality of said reference impedance circuits, said impedance-to-digital converter further comprising a reference selector having a plurality of inputs respectively coupled to said reference impedance circuits for receiving the third electric charges therefrom, and an output coupled to said conversion block, wherein said reference selector is configured to selectively provide at least one of the third electric charges to said conversion block.

8. The impedance-to-digital converter of claim 7, wherein said voltage-to-digital unit is further configured to generate an inverted digital signal that is complementary to the digital signal;

wherein said reference impedance unit further includes:

a first AND gate configured to perform AND operation on the digital signal and the first control signal so as to generate a first operation signal; and a second AND gate configured to perform AND operation on the inverted digital signal and the first control signal so as to generate a second operation signal;

wherein each of said reference impedance circuits includes:

a reference capacitor having a first terminal and a second terminal;

a first reference switch coupled to said first AND gate to receive the first operation signal therefrom, disposed to introduce the reference signal to said first terminal of said reference capacitor when conducting, and configured to conduct or not conduct according to the first operation signal;

a second reference switch coupled to said first AND gate to receive the first operation signal therefrom, disposed to couple said second terminal of said reference capacitor to ground when conducting, and configured to conduct or not conduct according to the first operation signal;

a third reference switch disposed to receive the second control signal, having a first terminal at which the third electric charge is outputted when said third reference switch is conducting, and a second terminal coupled to said first terminal of said reference capacitor, and configured to establish or not establish connection between said first and second terminals thereof to be conducting or non-conducting according to the second control signal;

a fourth reference switch disposed to receive the second control signal, to introduce the reference signal to said second terminal of said reference capacitor when conducting, and configured to conduct or not conduct according to the second control signal;

a fifth reference switch coupled to said second AND gate to receive the second operation signal therefrom, disposed to couple said first terminal of said reference capacitor to ground when conducting, and configured to conduct or not conduct according to the second operation signal; and a sixth reference switch coupled to said second AND gate to receive the second operation signal therefrom, disposed to introduce the reference signal to said second terminal of said reference capacitor when conducting, and configured to conduct or not conduct according to the second operation signal.

9. The impedance-to-digital converter of claim 3, the sensing signal including a sensing voltage, the offset signal including an offset voltage, the reference signal including a reference voltage, and the to-be-sensed component including a to-be-sensed capacitor that has the first and second terminals of the to-be-sensed component, wherein said offset impedance unit includes an offset capacitor, said reference impedance unit includes a reference capacitor, and said impedance-to-digital converter is configured to satisfy:

$$\frac{Z}{N} = \frac{C_{SEN} \times V_{SEN} - C_{SUB} \times V_{OFF} + C_{REF} \times V_{REF}}{2 \times C_{REF} \times V_{REF}}; \text{ and}$$

-continued $$C_{SUB} \times \frac{V_{OFF}}{V_{SEN}} - C_{REF} \times \frac{V_{REF}}{V_{SEN}} \leq C_{SEN} \leq C_{SUB} \times \frac{V_{OFF}}{V_{SEN}} + C_{REF} \times \frac{V_{REF}}{V_{SEN}};$$

where
- "N" represents the predetermined number of the operation periods,
- "Z" represents the number of the operation periods that correspond to the predetermined logic level of the digital signal among the predetermined number of the operation periods,
- "$C_{SEN}$" represents the impedance value of the to-be-sensed capacitor sensed by said impedance-to-digital converter,
- "$C_{SUB}$" represents capacitance of said offset capacitor,
- "$C_{REF}$" represents capacitance of said reference capacitor,
- "$V_{SEN}$" represents a magnitude of the sensing voltage,
- "$V_{OFF}$" represents a magnitude of the offset voltage, and
- "$V_{REF}$" represents a magnitude of the reference voltage;

wherein the central value of the sensible impedance range of said impedance-to-digital converter is $$C_{SUB} \times \frac{V_{OFF}}{V_{SEN}}$$

and the sensing resolution of the impedance value sensed by said impedance-to-digital converter is proportional to $$\frac{V_{SEN}}{V_{REF}}.$$

10. The impedance-to-digital converter of claim 3, wherein said sensing unit further includes a sensing capacitor to be coupled to the to-be-sensed component in parallel.

11. The impedance-to-digital converter of claim 10, the sensing signal including a sensing current, the offset signal including an offset voltage, the reference signal including a reference voltage, and the to-be-sensed component including a to-be-sensed resistor that has the first and second terminals of the to-be-sensed component, wherein said offset impedance unit includes an offset capacitor, said reference impedance unit includes a reference capacitor, and said impedance-to-digital converter is configured to satisfy:

$$\frac{C_{SUB}}{C_{SEN}} \times \frac{V_{OFF}}{I_{SEN}} - \frac{C_{REF}}{C_{SEN}} \times \frac{V_{REF}}{I_{SEN}} \leq R_{SEN} \leq \frac{C_{SUB}}{C_{SEN}} \times \frac{V_{OFF}}{I_{SEN}} + \frac{C_{REF}}{C_{SEN}} \times \frac{V_{REF}}{I_{SEN}};$$

where
- "$R_{SEN}$" represents the impedance value of the to-be-sensed resistor sensed by said impedance-to-digital converter,
- "$C_{SEN}$" represents capacitance of said sensing capacitor,
- "$C_{SUB}$" represents capacitance of said offset capacitor,
- "$C_{REF}$" represents capacitance of said reference capacitor,
- "$I_{SEN}$" represents a magnitude of the sensing current,
- "$V_{OFF}$" represents a magnitude of the offset voltage, and
- "$V_{REF}$" represents a magnitude of the reference voltage;

wherein the central value of the sensible impedance range of said impedance-to-digital converter is $$\frac{C_{SUB}}{C_{SEN}} \times \frac{V_{OFF}}{I_{SEN}},$$

and the sensing resolution of the impedance value sensed by said impedance-to-digital converter is proportional to $$\frac{I_{SEN}}{V_{REF}}.$$

12. The impedance-to-digital converter of claim 10, wherein said offset impedance unit includes:
- an offset capacitor having a first terminal and a second terminal;
- an offset resistor coupled to said offset capacitor in parallel;
- a first offset switch disposed to receive the first control signal, to introduce the offset signal to said first terminal of said offset capacitor when conducting, and configured to conduct or not conduct according to the first control signal;
- a second offset switch disposed to receive the first control signal, to couple said second terminal of said offset capacitor to ground when conducting, and configured to conduct or not conduct according to the first control signal;
- a third offset switch disposed to receive the second control signal, having a first terminal at which the second electric charge is outputted when said third offset switch is conducting, a second terminal coupled to said first terminal of said offset capacitor, and configured to establish or not establish connection between said first and second terminals thereof to be conducting or non-conducting according to the second control signal; and
- a fourth offset switch disposed to receive the second control signal, to introduce the reference signal to said second terminal of said offset capacitor when conducting, and configured to conduct or not conduct according to the second control signal.

13. The impedance-to-digital converter of claim 12, the sensing signal including a sensing current, the offset signal including an offset current, the reference signal including a reference voltage, and the to-be-sensed component including a to-be-sensed resistor that has the first and second terminals of the to-be-sensed component, wherein said reference impedance unit includes a reference capacitor, and said impedance-to-digital converter is configured to satisfy:

$$\frac{C_{SUB}}{C_{SEN}} \times \frac{I_{OFF}}{I_{SEN}} \times R_{OFF} - \Delta R_{SEN} \leq R_{SEN} \leq \frac{C_{SUB}}{C_{SEN}} \times \frac{I_{OFF}}{I_{SEN}} \times R_{OFF} + \Delta R_{SEN};$$

$$\text{and } \Delta R_{SEN} = \frac{C_{REF}}{C_{SEN}} \times \frac{V_{REF}}{I_{SEN}};$$

where
- "$R_{SEN}$" represents the impedance value of the to-be-sensed resistor sensed by said impedance-to-digital converter,
- "$R_{OFF}$" represents resistance of said offset resistor,
- "$C_{SEN}$" represents capacitance of said sensing capacitor,
- "$C_{SUB}$" represents capacitance of said offset capacitor,
- "$C_{REF}$" represents capacitance of said reference capacitor,
- "$I_{SEN}$" represents a magnitude of the sensing current, "$I_{OFF}$" represents a magnitude of the offset current, and "$V_{REF}$" represents a magnitude of the reference voltage.

14. The impedance-to-digital converter of claim 3, wherein said sensing unit further includes a fifth switch, a sensing capacitor and a sixth switch that are to be coupled in series in the given order between the first and second terminals of the to-be-sensed component.

15. The impedance-to-digital converter of claim 1, the to-be-sensed component having a first terminal and a second terminal, wherein said sensing unit includes:
a first sensing switch disposed to receive a first control signal, and to introduce the sensing signal to the first terminal of the to-be-sensed component when conducting, and configured to conduct or not conduct according to a first control signal;
a second sensing switch disposed to receive a first control signal, and to couple the second terminal of the to-be-sensed component to ground when conducting, and configured to conduct or not conduct according to the first control signal;
a third sensing switch disposed to receive a second control signal, and to introduce the reference signal to the first terminal of the to-be-sensed component when conducting, and configured to conduct or not conduct according to the second control signal; and
a fourth sensing switch disposed to receive the second control signal, having a first terminal at which the first electric charge is outputted when said fourth sensing switch is conducting, and a second terminal to be coupled to the second terminal of the to-be-sensed component, and configured to establish or not establish connection between said first and second terminals thereof to be conducting or non-conducting according to the second control signal;
wherein said first sensing switch and said third sensing switch do not conduct at the same time.

16. An impedance-to-digital converting device for sensing an impedance value of a to-be-sensed component, comprising:
an impedance-to-digital converter including:
a sensing unit to be coupled to the to-be-sensed component, disposed to receive a sensing signal, and configured to periodically convert the sensing signal into a first electric charge by providing, within every operation period of said impedance-to-digital converter, the sensing signal to the to-be-sensed component, an amount of the first electric charge being proportional to a magnitude of the sensing signal;
an offset impedance unit disposed to receive an offset signal, and configured to convert the offset signal into a second electric charge every operation period of said impedance-to-digital converter, an amount of the second electric charge being proportional to a magnitude of the offset signal;
a reference impedance unit disposed to receive a reference signal and a digital signal that has a series of logic values, and including a reference impedance circuit configured to convert the reference signal into a third electric charge every operation period of said impedance-to-digital converter, an amount of the third electric charge being proportional to a magnitude of the reference signal, a polarity of the third electric charge being associated with a logic level of the digital signal; and
a conversion block receiving the first electric charge, the second electric charge and the third electric charge that are respectively outputted by said sensing unit, said offset impedance unit and said reference impedance unit to cooperatively form a resultant electric charge, and configured to convert the resultant electric into the digital signal; and
an operation unit coupled to said conversion block for receiving therefrom the digital signal, and configured to perform an average operation of the series of logic values of the digital signal to generate a series-average value;
wherein said operation unit includes a lookup table recording a pre-stored impedance value that corresponds to the series-average value thus generated, and is further configured to obtain the pre-stored impedance value from said lookup table according to the series-average value, and to output the pre-stored impedance value to serve as a sensed impedance value corresponding to the to-be-sensed component;
wherein the impedance value sensed by said impedance-to-digital converting device has a linear relationship with a number of the operation periods that correspond to a predetermined logic level of the digital signal among a predetermined number of the operation periods;
wherein a central value of a sensible impedance range of said impedance-to-digital converter is proportional to a ratio of a magnitude of the offset signal to a magnitude of the sensing signal;
wherein the impedance value sensed by impedance-to-digital converting device has a sensing resolution proportional to a ratio of the magnitude of the sensing signal to a magnitude of the reference signal.

17. An impedance-to-digital converter for sensing an impedance value of a to-be-sensed component, the to-be-sensed component having a first terminal and a second terminal, said impedance-to-digital converter comprising:
a sensing unit to be coupled to the to-be-sensed component, disposed to receive a sensing signal, and configured to periodically convert the sensing signal into a first electric charge by providing, within every operation period of said impedance-to-digital converter, the sensing signal to the to-be-sensed component, an amount of the first electric charge being proportional to a magnitude of the sensing signal;
an offset impedance unit disposed to receive an offset signal, and configured to convert the offset signal into a second electric charge every operation period of said impedance-to-digital converter, an amount of the second electric charge being proportional to a magnitude of the offset signal;
a reference impedance unit disposed to receive a reference signal and a digital signal, and including a reference impedance circuit configured to convert the reference signal into a third electric charge every operation period of said impedance-to-digital converter, an amount of the third electric charge being proportional to a magnitude of the reference signal, a polarity of the third electric charge being associated with a logic level of the digital signal; and
a conversion block receiving the first electric charge, the second electric charge and the third electric charge that are respectively outputted by said sensing unit, said offset impedance unit and said reference impedance unit to cooperatively form a resultant electric charge, and configured to convert the resultant electric charge into the digital signal;
wherein the impedance value sensed by said impedance-to-digital converter has a linear relationship with a number of the operation periods that correspond to a predetermined logic level of the digital signal among a predetermined number of the operation periods;

wherein a central value of a sensible impedance range of said impedance-to-digital converter is proportional to a ratio of a magnitude of the offset signal to a magnitude of the sensing signal;

wherein said sensing unit includes:
- a first sensing switch disposed to receive a first control signal, and to introduce the sensing signal to the first terminal of the to-be-sensed component when conducting, and configured to conduct or not conduct according to a first control signal;
- a second sensing switch disposed to receive a first control signal, and to couple the second terminal of the to-be-sensed component to ground when conducting, and configured to conduct or not conduct according to the first control signal;
- a third sensing switch disposed to receive a second control signal, and to introduce the reference signal to the first terminal of the to-be-sensed component when conducting, and configured to conduct or not conduct according to the second control signal; and
- a fourth sensing switch disposed to receive the second control signal, having a first terminal at which the first electric charge is outputted when said fourth sensing switch is conducting, and a second terminal to be coupled to the second terminal of the to-be-sensed component, and configured to establish or not establish connection between said first and second terminals thereof to be conducting or non-conducting according to the second control signal;

wherein said first sensing switch and said third sensing switch do not conduct at the same time.

* * * * *